(12) United States Patent
Maruyama et al.

(10) Patent No.: US 11,769,782 B2
(45) Date of Patent: Sep. 26, 2023

(54) SOLID-STATE IMAGING ELEMENT AND IMAGING APPARATUS

(71) Applicant: SONY SEMICONDUCTOR SOLUTIONS CORPORATION, Kanagawa (JP)

(72) Inventors: Shunsuke Maruyama, Kanagawa (JP); Hideki Minari, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 177 days.

(21) Appl. No.: 17/047,654

(22) PCT Filed: Apr. 8, 2019

(86) PCT No.: PCT/JP2019/015254
§ 371 (c)(1),
(2) Date: Oct. 14, 2020

(87) PCT Pub. No.: WO2019/211968
PCT Pub. Date: Nov. 7, 2019

(65) Prior Publication Data
US 2021/0043677 A1    Feb. 11, 2021

(30) Foreign Application Priority Data

May 2, 2018    (JP) ................................ 2018-088561

(51) Int. Cl.
*H01L 27/146*    (2006.01)
(52) U.S. Cl.
CPC .. *H01L 27/14649* (2013.01); *H01L 27/14694* (2013.01)
(58) Field of Classification Search
CPC ......... H01L 27/14649; H01L 27/14694; H01L 31/10; H01L 27/1443; H04N 5/369
See application file for complete search history.

(56) References Cited

U.S. PATENT DOCUMENTS 4,684,969 A * 8/1987 Taguchi .......... H01L 31/035236
257/438
4,783,689 A * 11/1988 Nishida ................. H01L 31/109
257/609

(Continued)

FOREIGN PATENT DOCUMENTS

JP    58-170055 A    10/1983
JP    59-028391 A    2/1984

(Continued)

OTHER PUBLICATIONS

International Search Report and Written Opinion of PCT Application No. PCT/JP2019/015254, dated Jul. 9, 2019, 09 pages of ISRWO.

*Primary Examiner* — Bitew A Dinke
(74) *Attorney, Agent, or Firm* — CHIP LAW GROUP

(57) ABSTRACT

A solid-state imaging element including a photoelectric conversion layer of a first electrical conductivity type including a plurality of pixel regions, an electrode electrically coupled to the photoelectric conversion layer and provided for each of the pixel regions, a semiconductor layer provided between the electrode and the photoelectric conversion layer and having a bandgap larger than a bandgap of the photoelectric conversion layer, a diffusion part disposed in a vicinity of an edge of the pixel region and including an impurity of a second electrical conductivity type that is diffused from the semiconductor layer across the photoelectric conversion layer, and a non-diffusion part provided inside the diffusion part and not including the impurity of the second electrical conductivity type in the photoelectric conversion layer.

12 Claims, 20 Drawing Sheets

(56) References Cited

U.S. PATENT DOCUMENTS

| | | | | |
|---|---|---|---|---|
| 4,797,371 A * | 1/1989 | Kuroda | H01L 29/6659 | 438/420 |
| 4,840,916 A * | 6/1989 | Yasuda | H01L 31/1075 | 438/494 |
| 4,974,061 A * | 11/1990 | Torikai | H01L 31/1844 | 257/495 |
| 5,057,891 A * | 10/1991 | Torikai | H01L 31/1075 | 257/605 |
| 5,179,431 A * | 1/1993 | Shirai | H01L 31/1075 | 257/187 |
| 5,406,097 A * | 4/1995 | Kusakabe | H01L 31/1075 | 257/438 |
| 2005/0194654 A1* | 9/2005 | Iguchi | H01L 27/14601 | 257/458 |
| 2005/0199976 A1* | 9/2005 | Iguchi | H01L 27/1446 | 257/458 |
| 2012/0113292 A1* | 5/2012 | Hirota | H01L 27/1463 | 348/222.1 |
| 2012/0175686 A1* | 7/2012 | Hirota | H01L 27/14656 | 257/E27.15 |
| 2014/0021575 A1* | 1/2014 | Ishihara | H01L 27/14645 | 438/66 |
| 2015/0207027 A1* | 7/2015 | Boulard | H01L 27/14636 | 438/26 |
| 2015/0303322 A1* | 10/2015 | Mollard | H01L 31/02966 | 257/443 |
| 2016/0020241 A1* | 1/2016 | Mollard | H01L 27/1463 | 257/443 |
| 2016/0111580 A1* | 4/2016 | Gravrand | H01L 31/1035 | 438/73 |
| 2017/0194367 A1* | 7/2017 | Fotopoulou | G01S 7/4863 | |
| 2017/0309663 A1* | 10/2017 | Rothman | H01L 27/14607 | |
| 2018/0350851 A1* | 12/2018 | Yoshida | H01L 27/1443 | |
| 2019/0025414 A1* | 1/2019 | Van Der Tempel | H01L 27/1461 | |
| 2021/0029309 A1* | 1/2021 | Maruyama | H04N 5/347 | |

FOREIGN PATENT DOCUMENTS

| | | | | |
|---|---|---|---|---|
| JP | 63-224372 A | 9/1988 | | |
| JP | 09-051119 A | 2/1997 | | |
| WO | 2017/154444 A1 | 9/2017 | | |
| WO | WO-2017150167 A1 * | 9/2017 | | H01L 27/14603 |

\* cited by examiner

[FIG. 1]
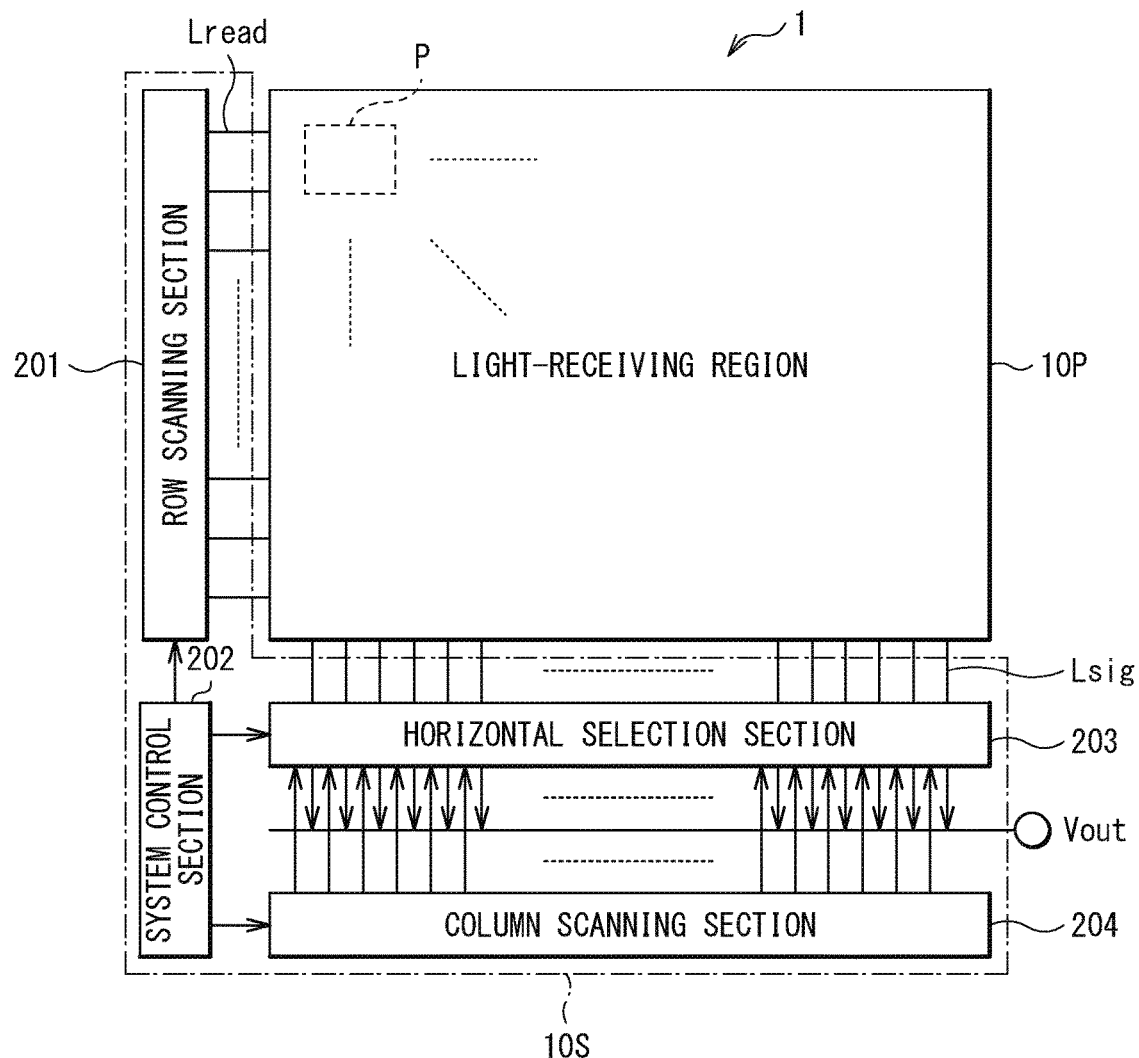

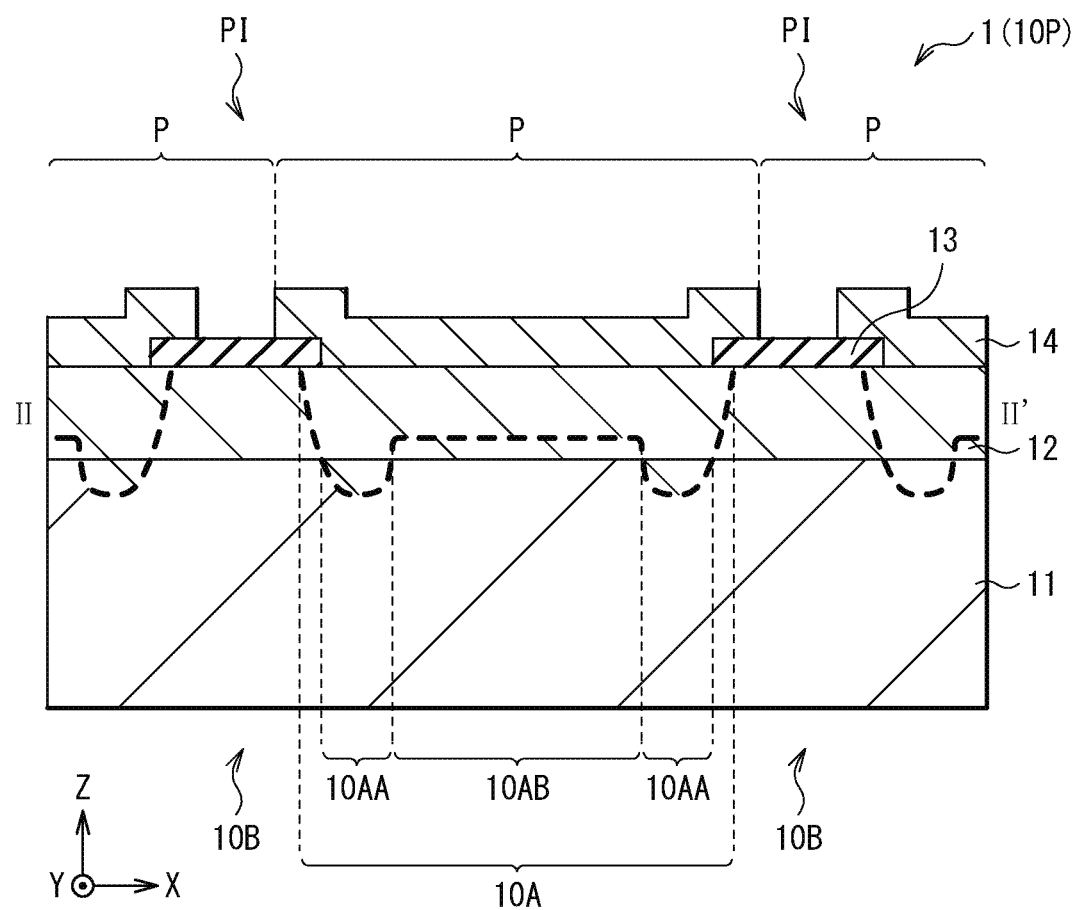
[FIG. 2]

[FIG. 3]
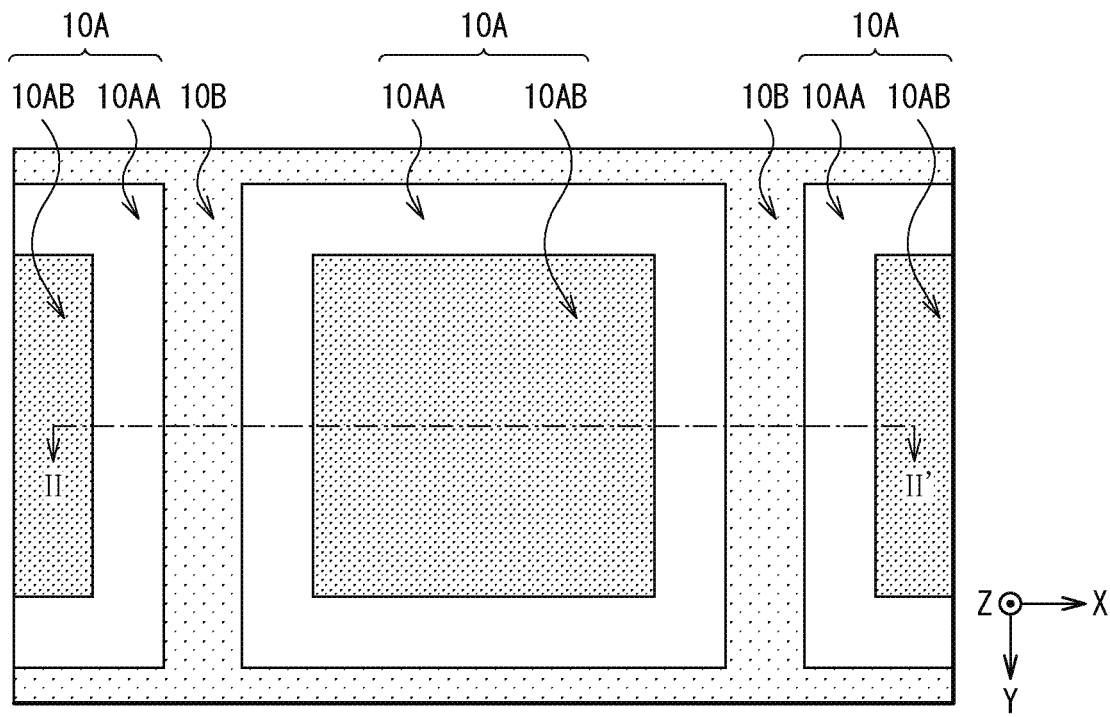
[FIG. 4]
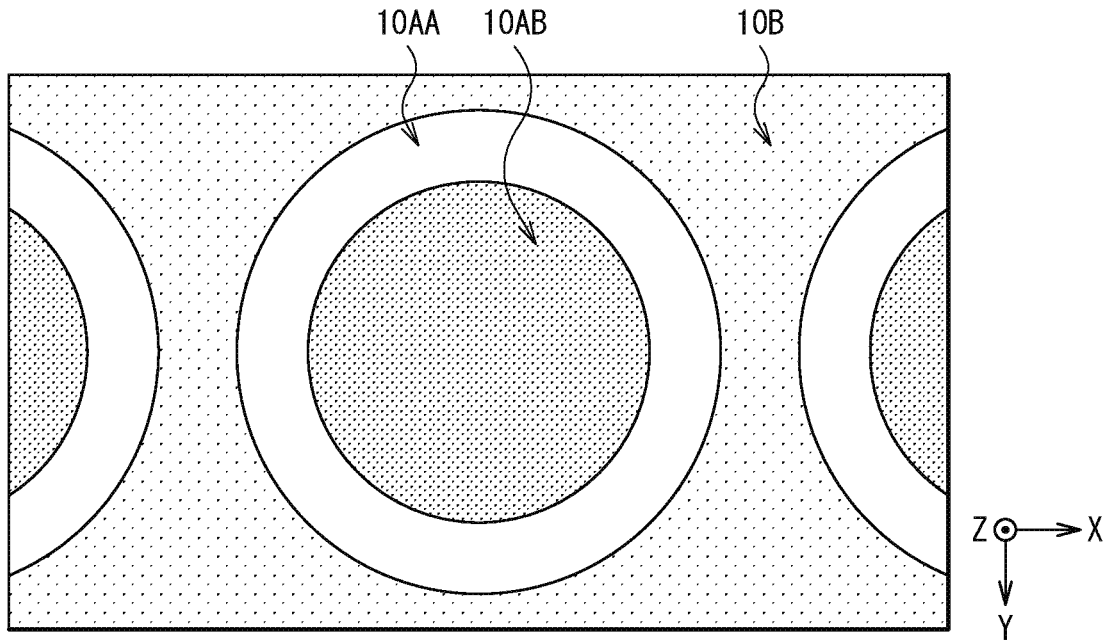

[FIG. 5]
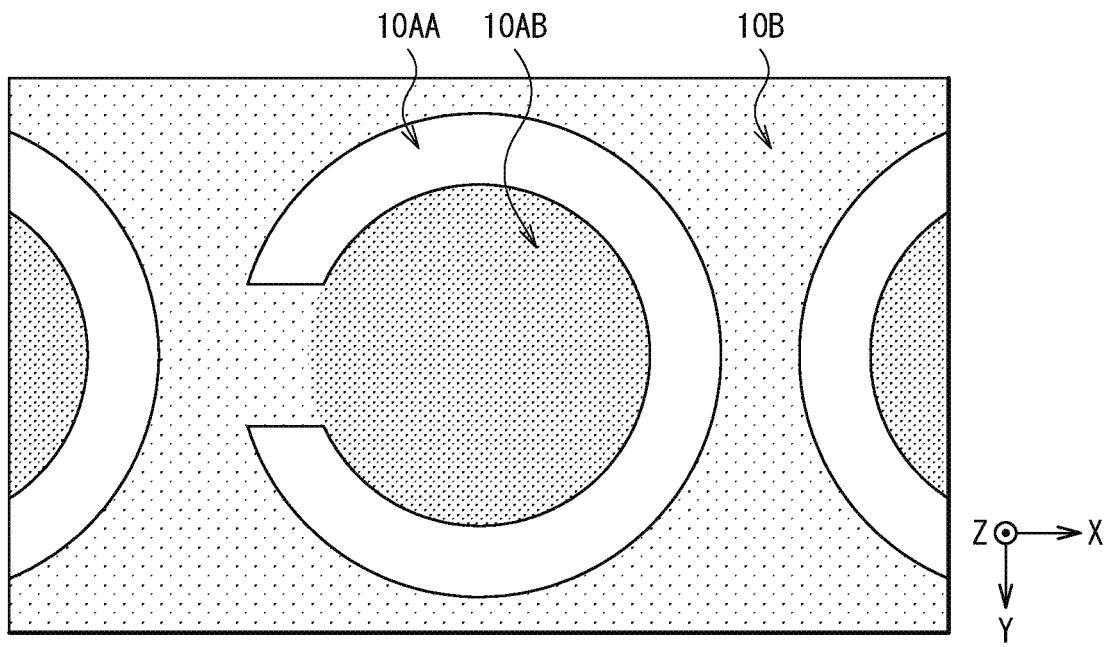
[FIG. 6]
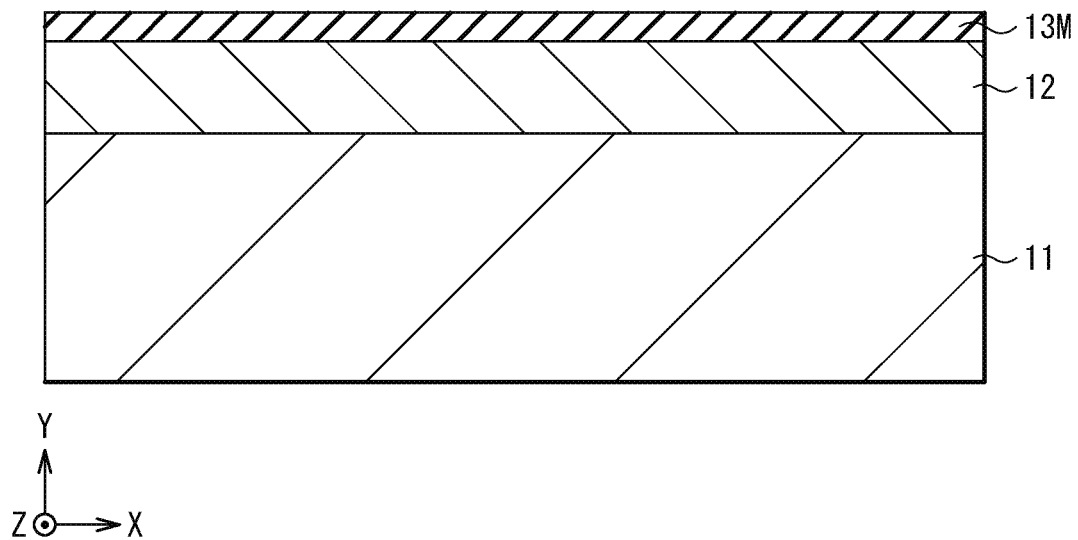

[FIG. 7A]
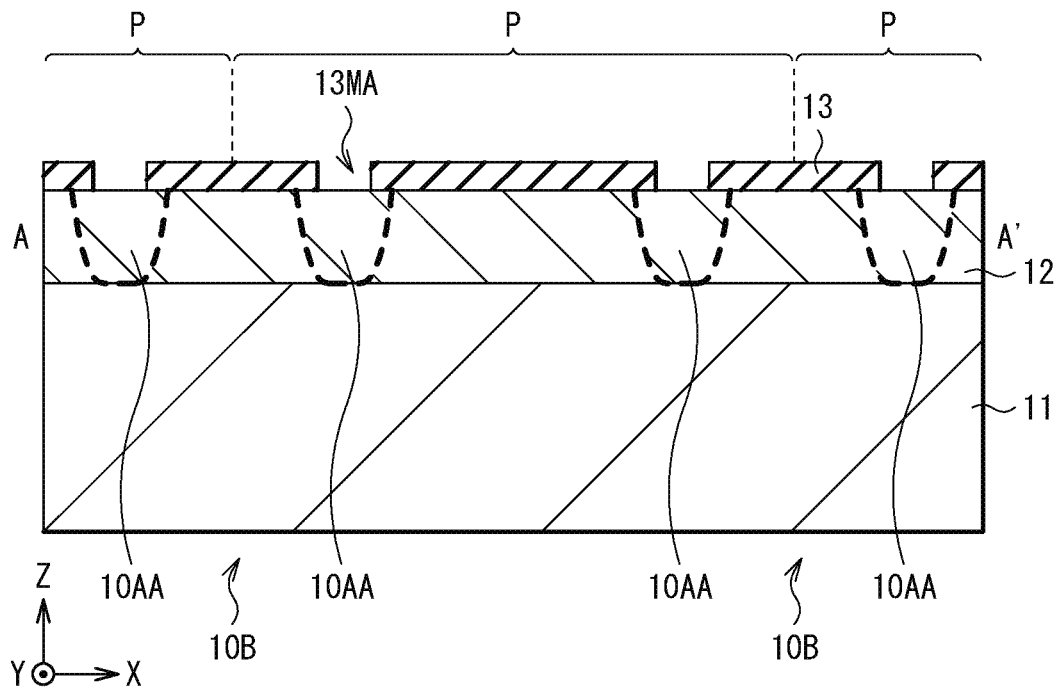
[FIG. 7B]
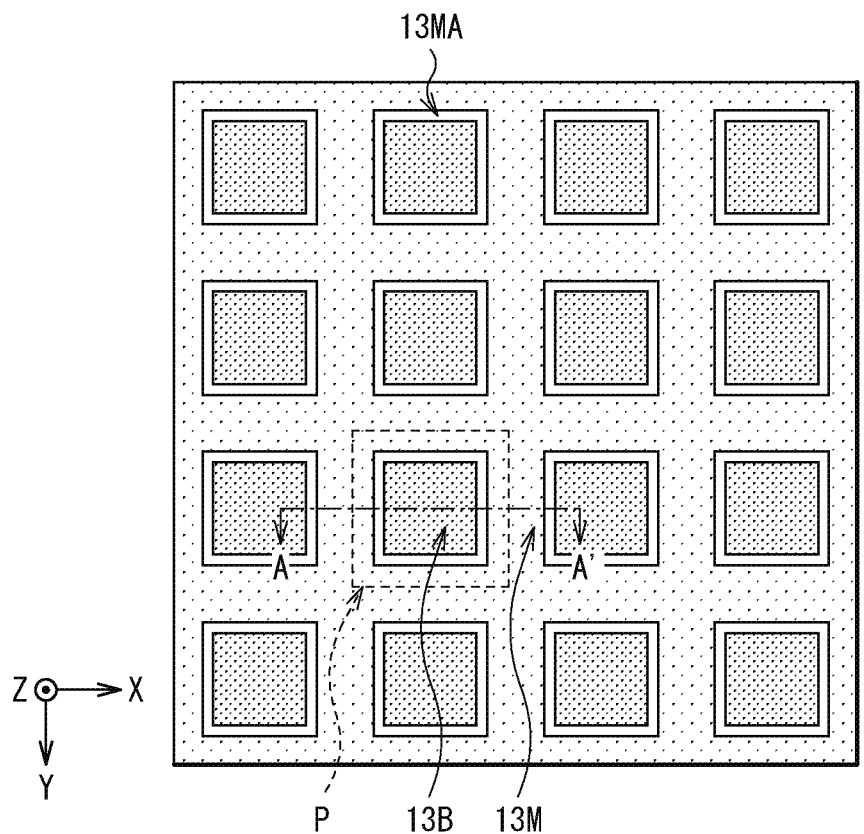

[FIG. 8A]
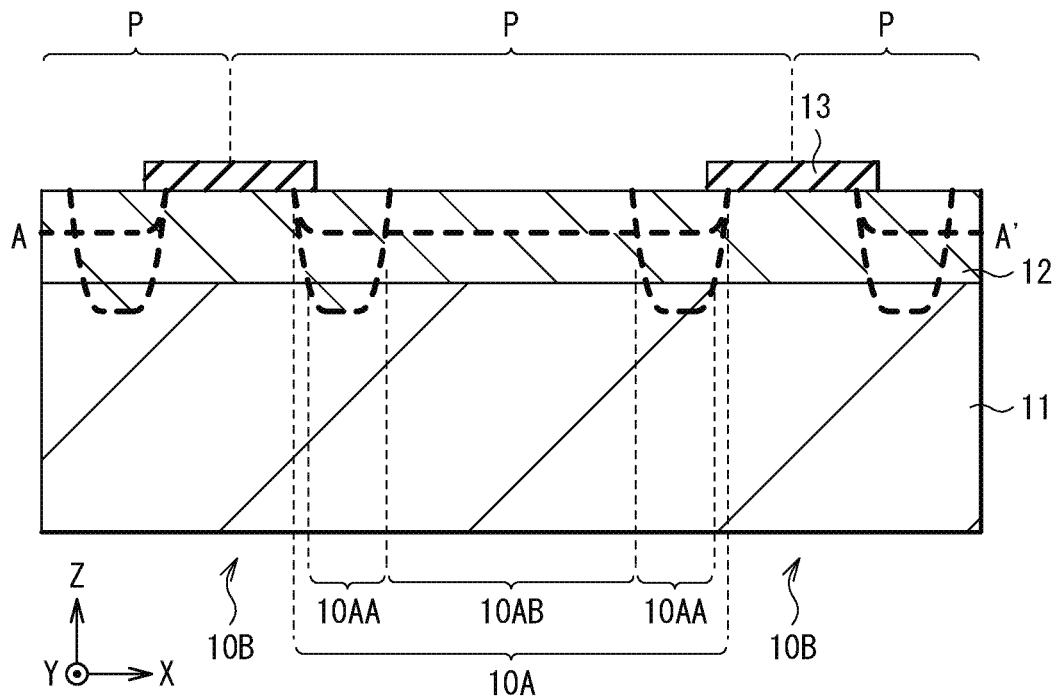
[FIG. 8B]
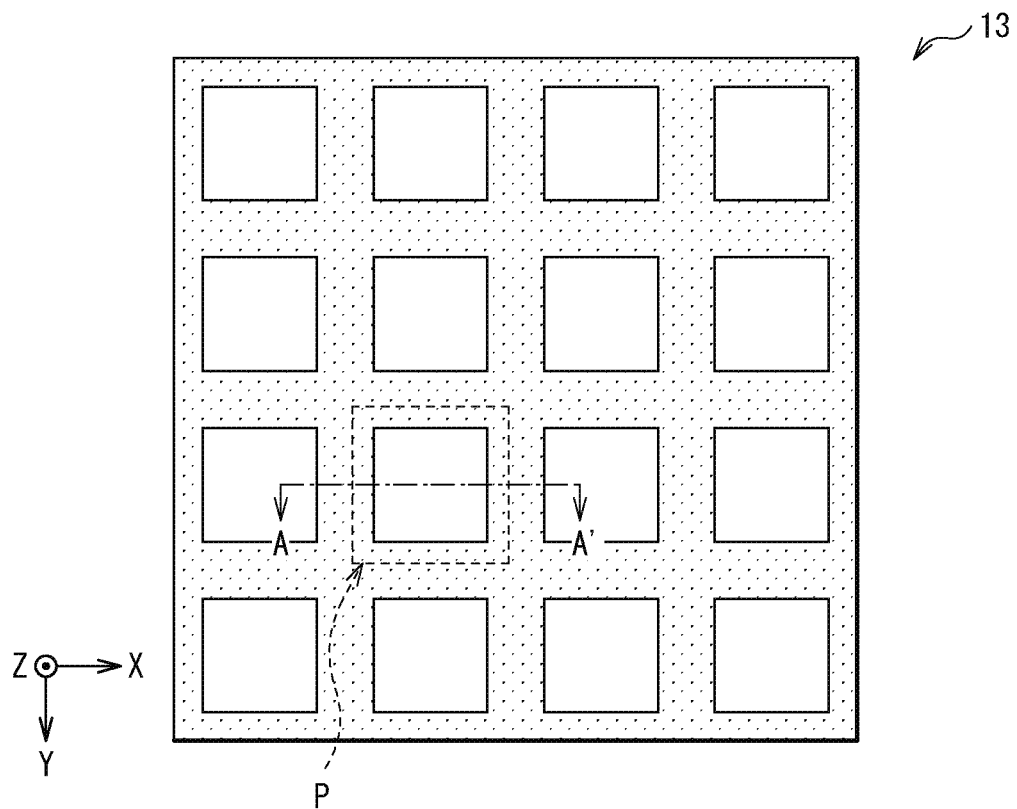

[FIG. 9A]
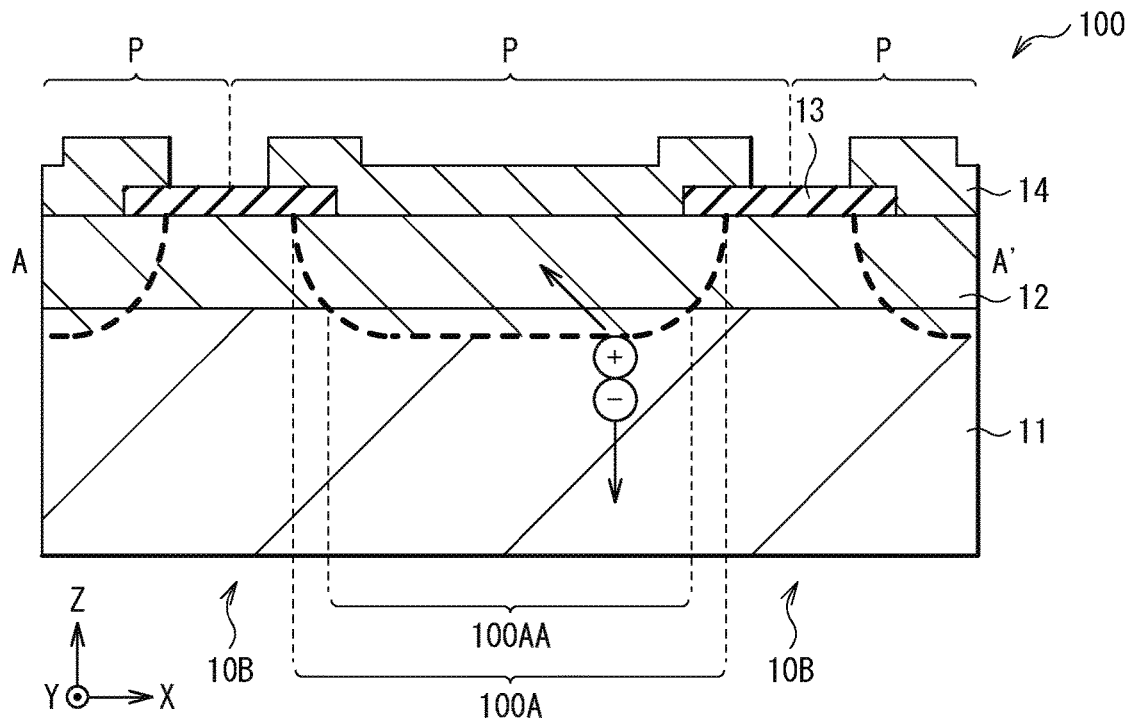
[FIG. 9B]
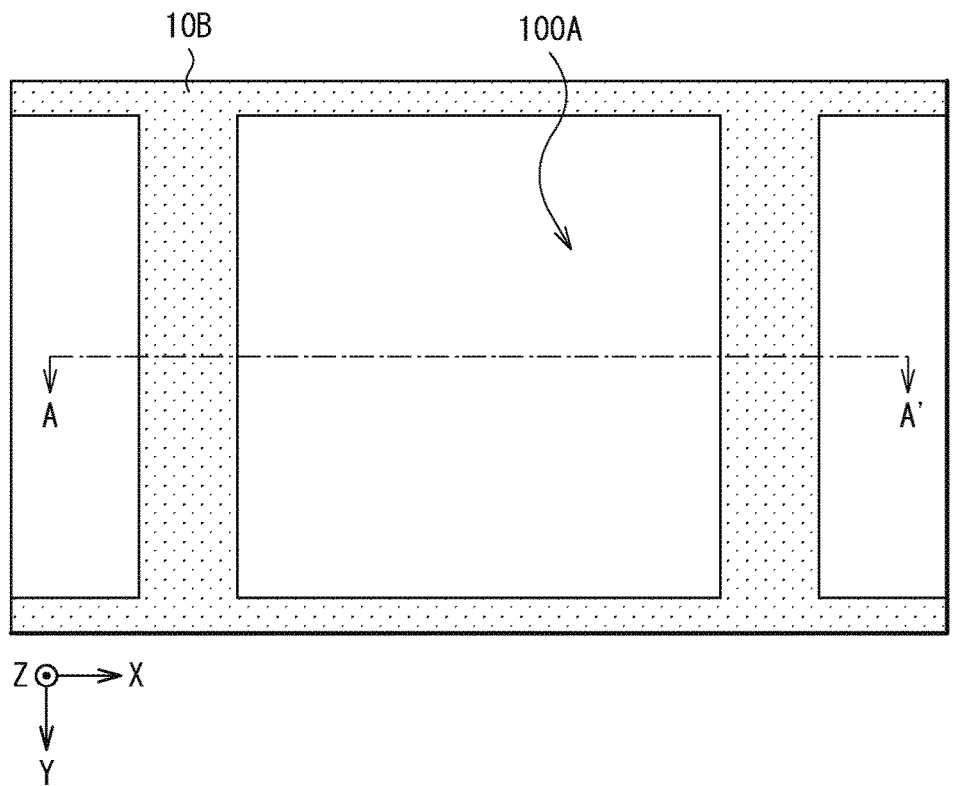

[FIG. 10]
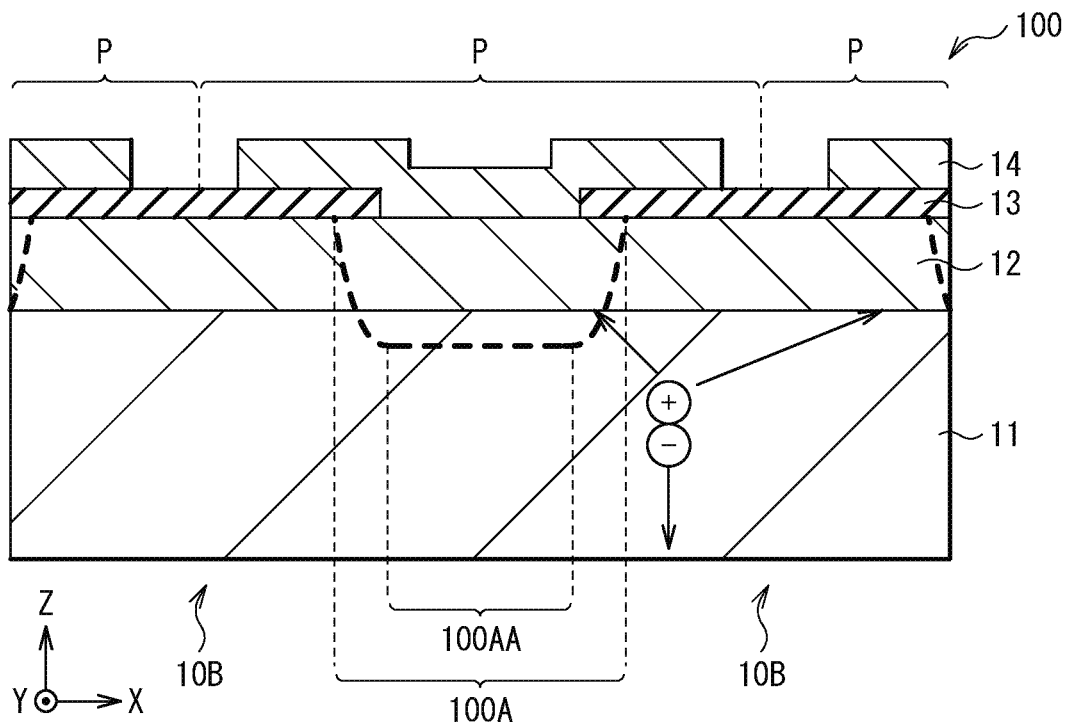
[FIG. 11]
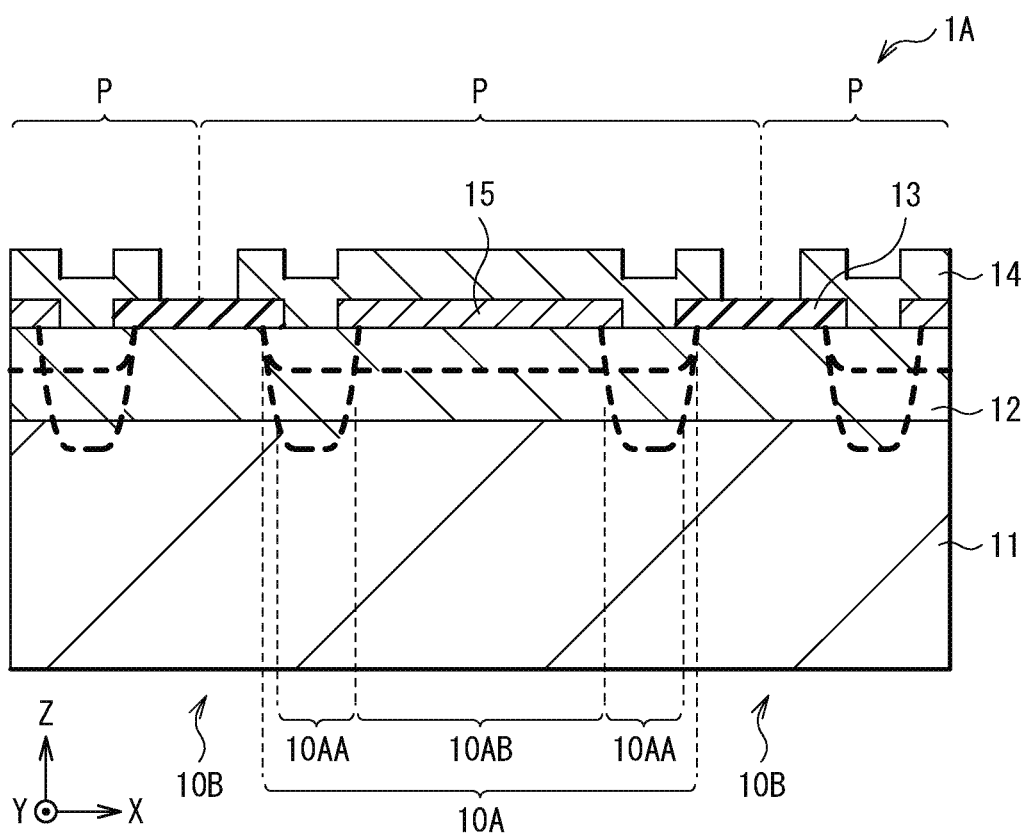

[FIG. 12]
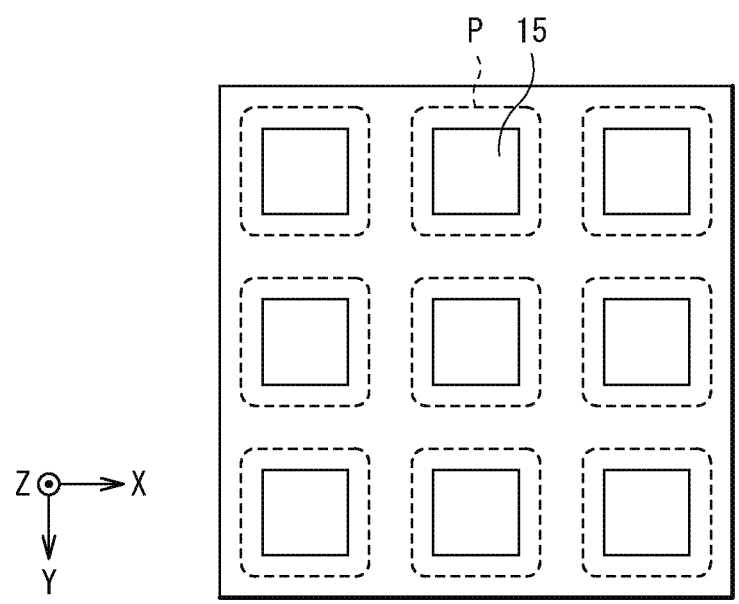

[FIG. 13]
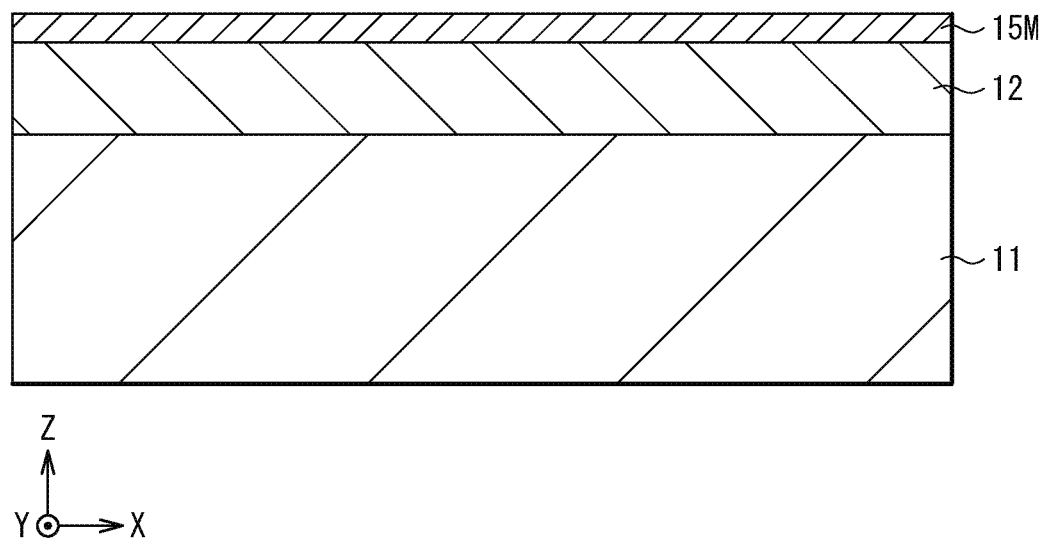
[FIG. 14]
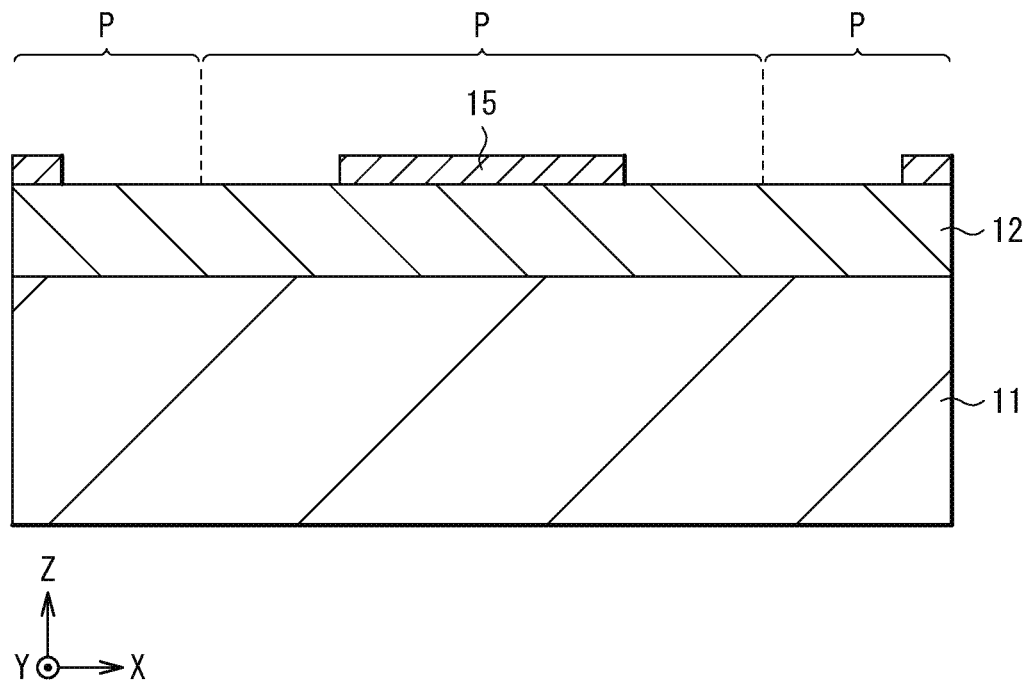

[FIG. 15]
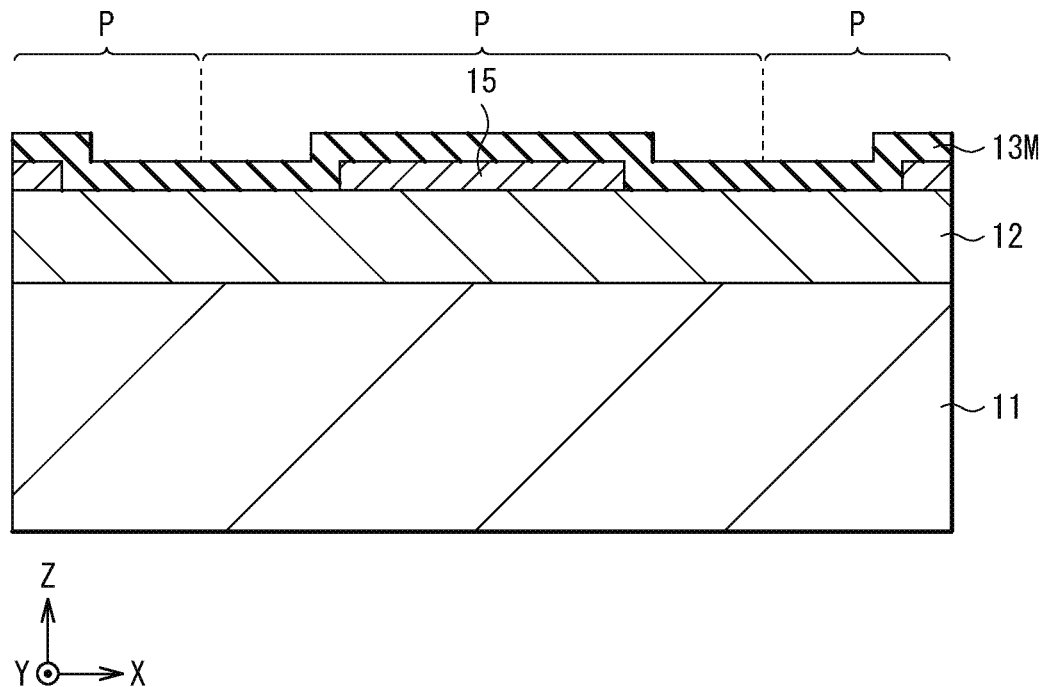
[FIG. 16]
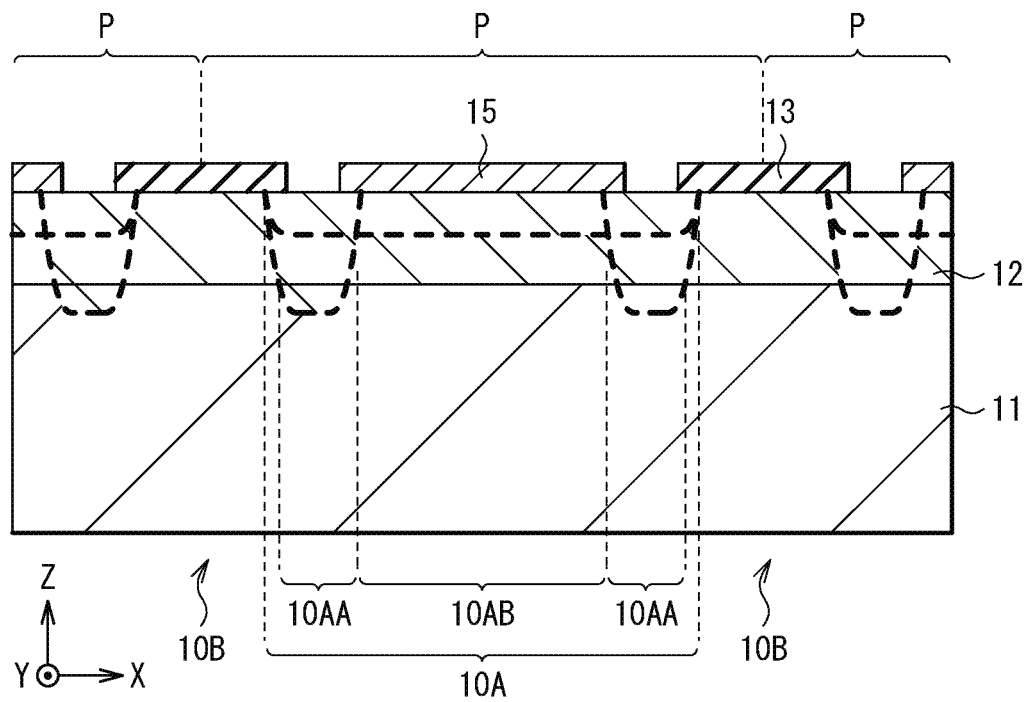

[FIG. 17A]
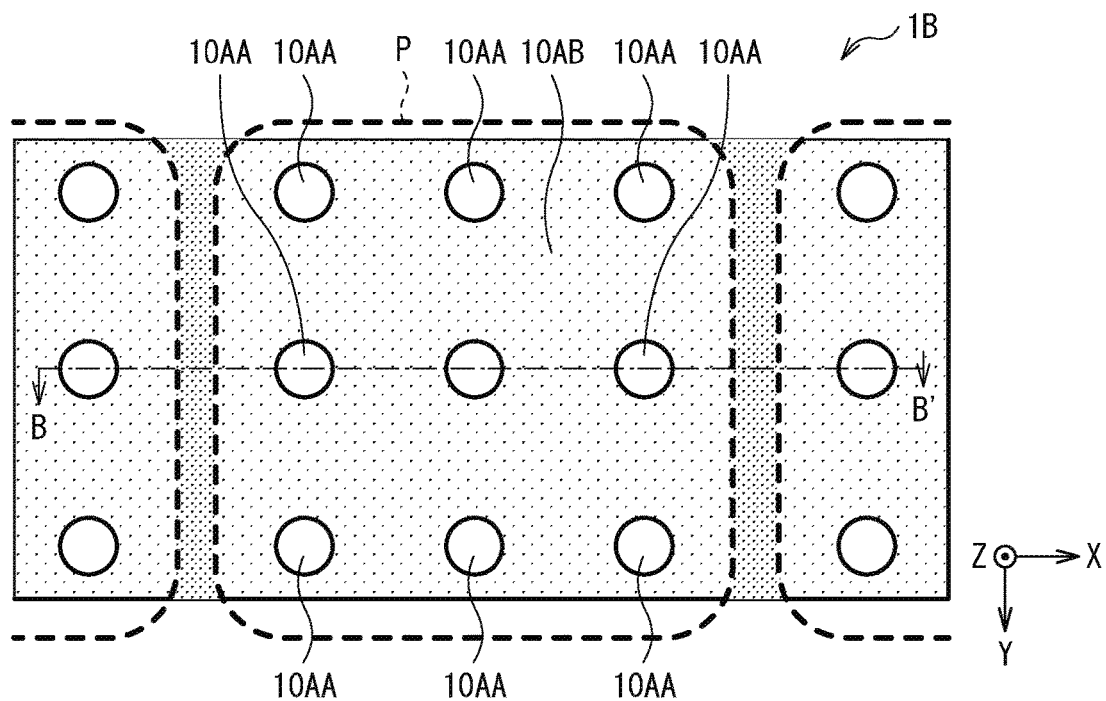
[FIG. 17B]
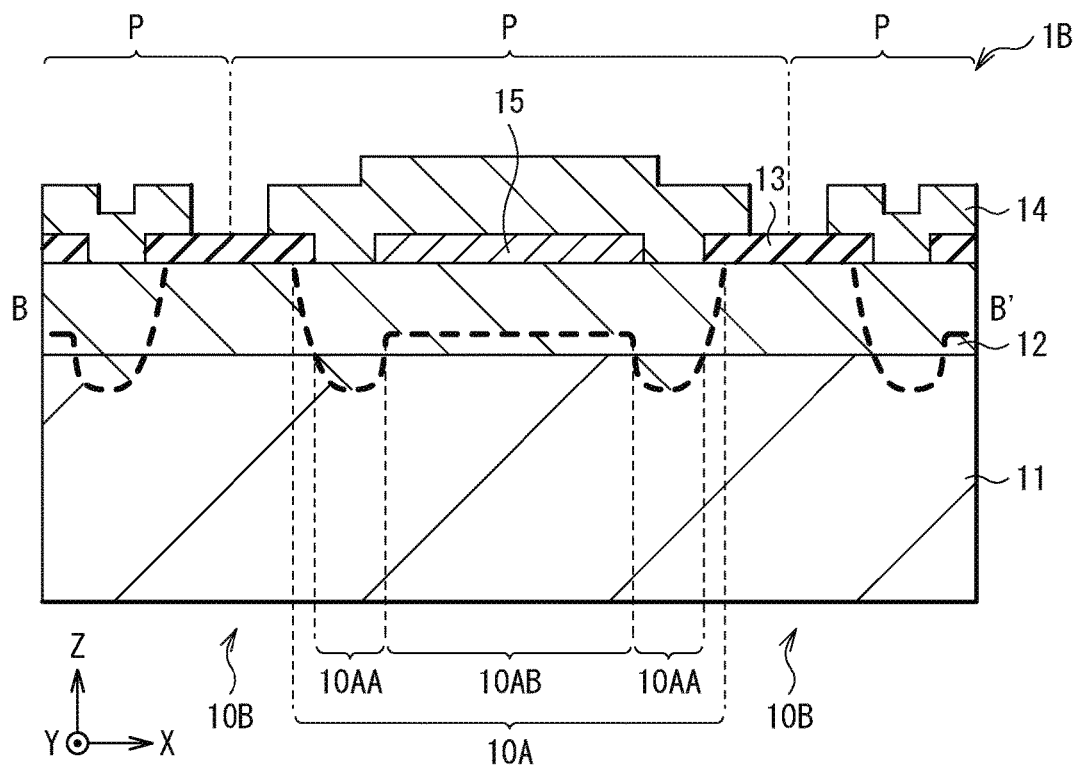

[FIG. 18A]
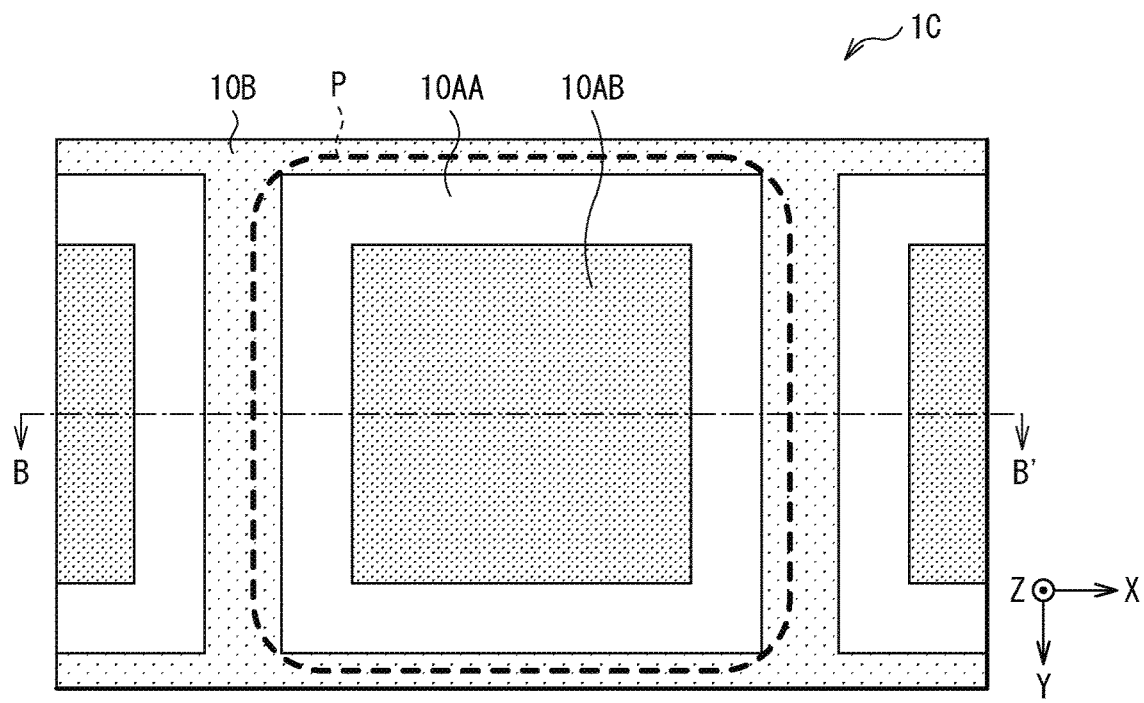
[FIG. 18B]
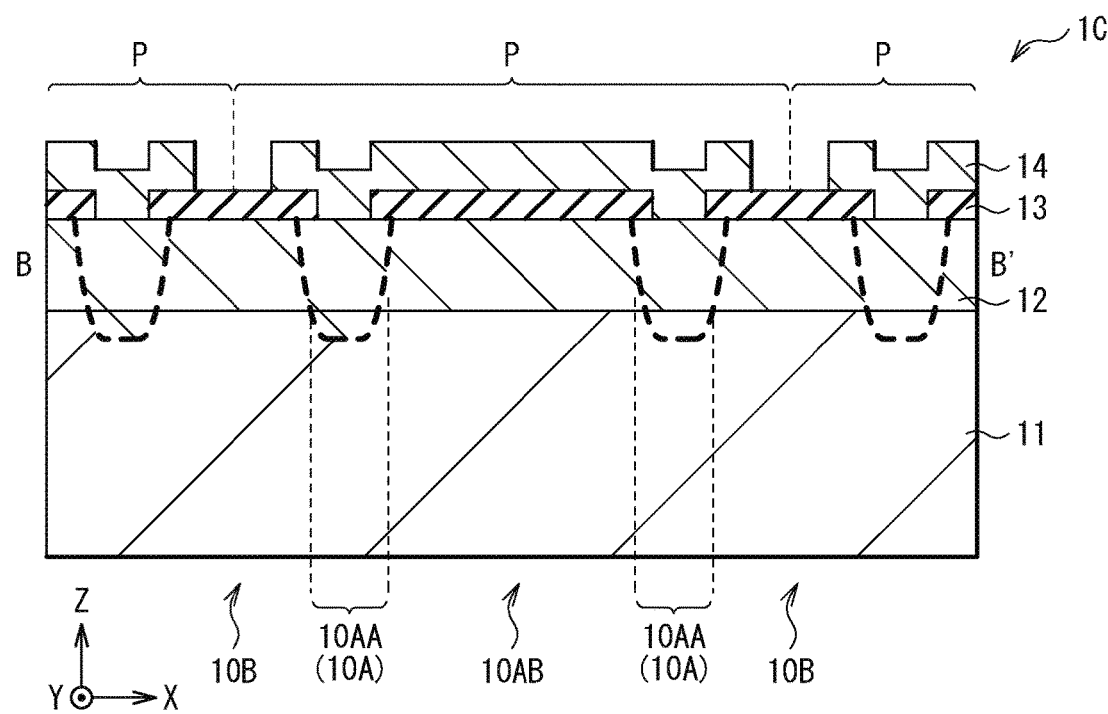

[FIG. 19A]
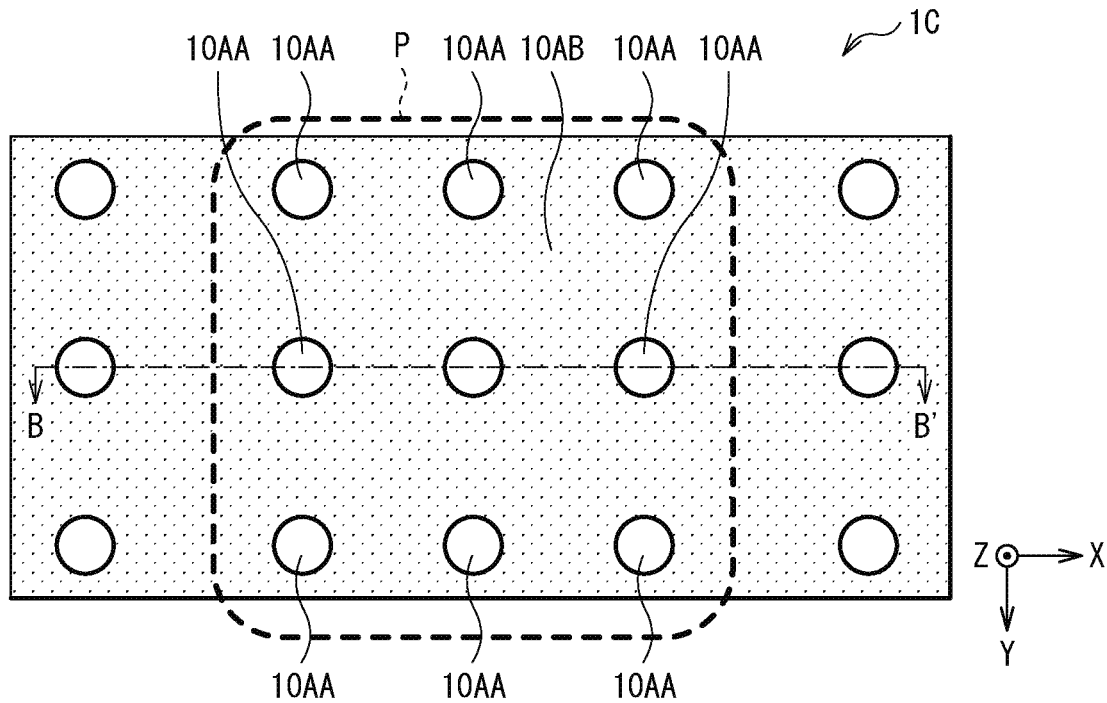
[FIG. 19B]
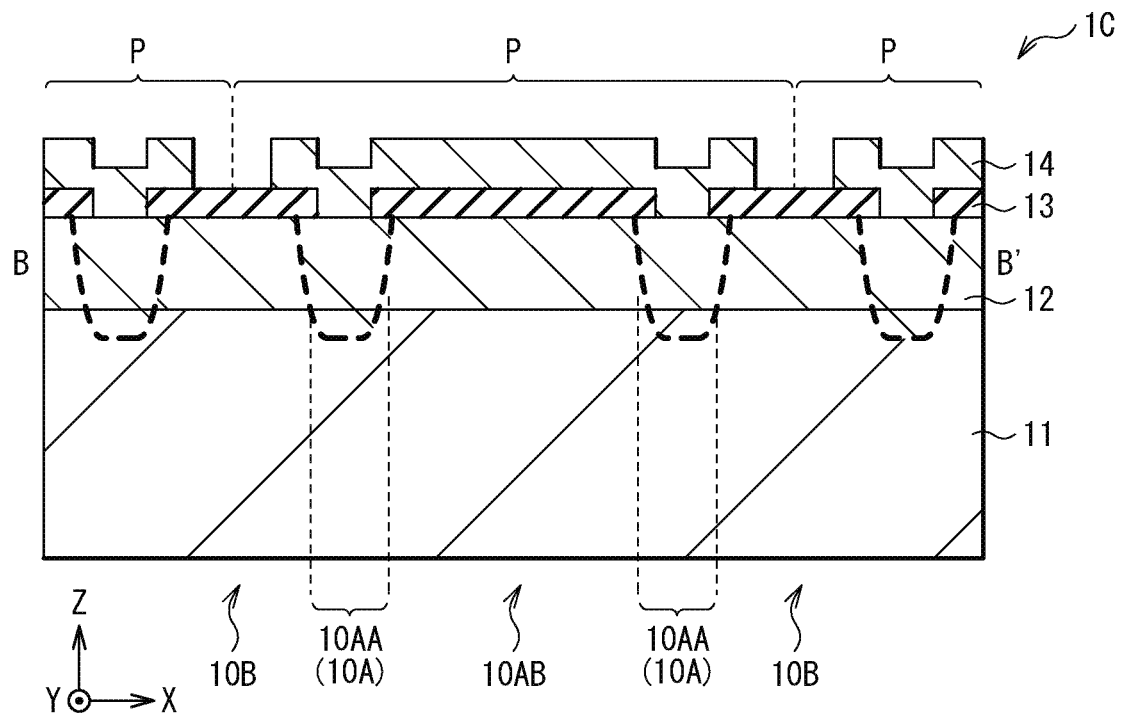

[FIG. 20]
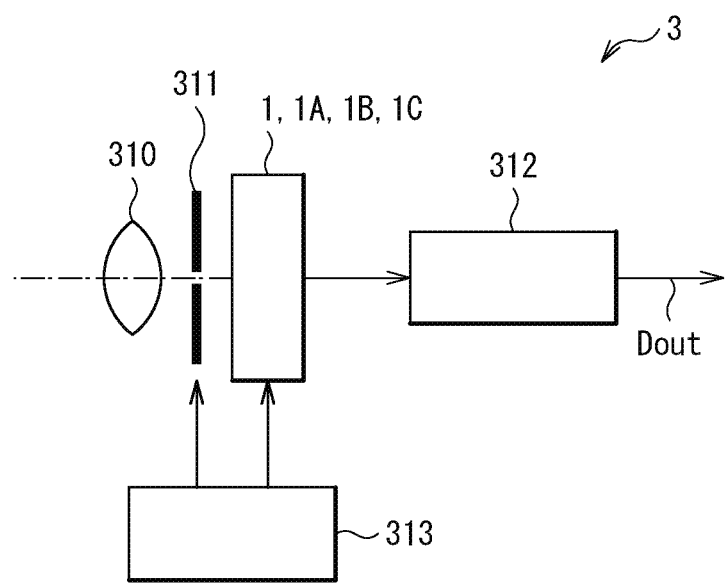

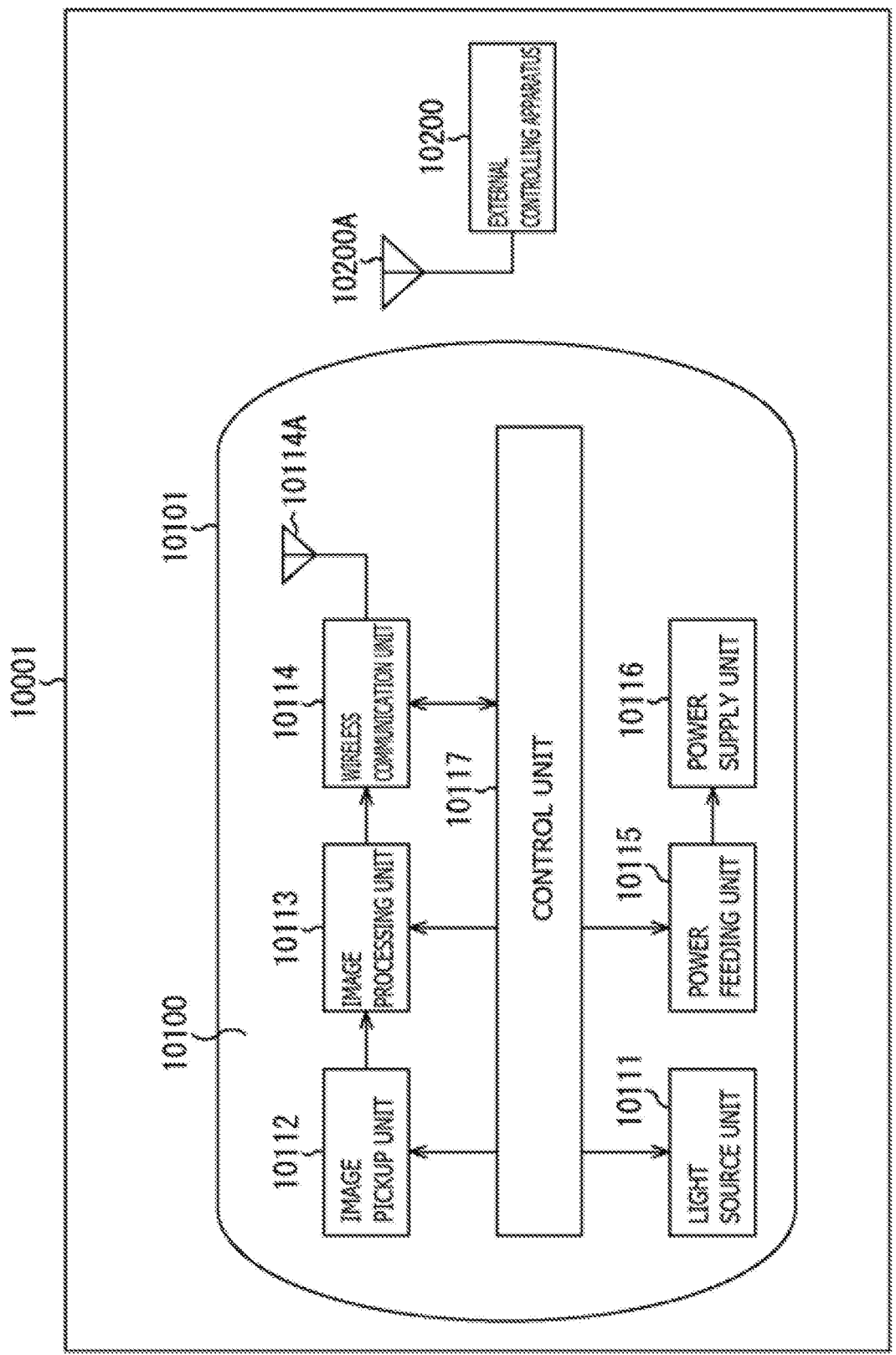
[FIG. 21]

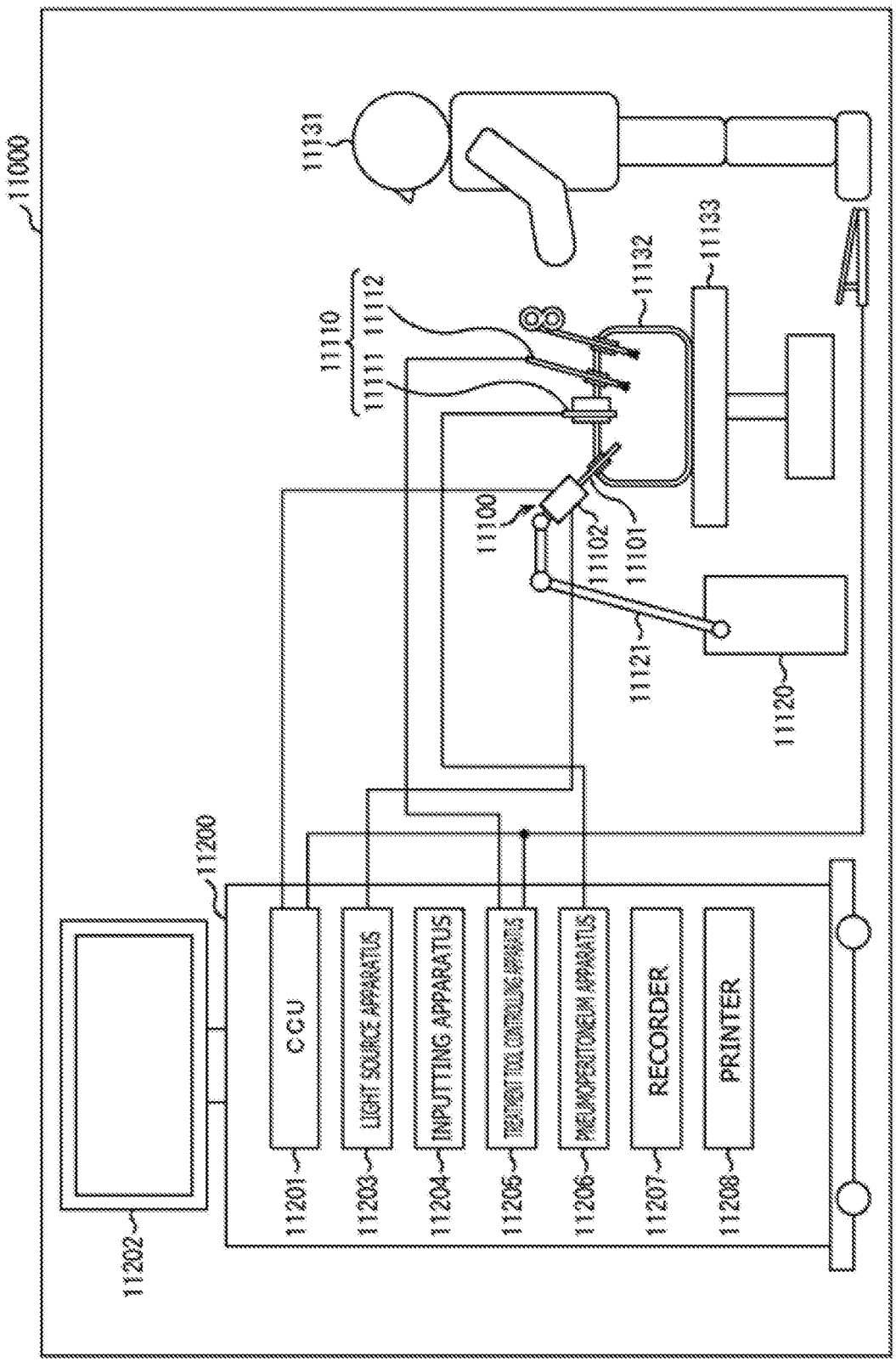
[FIG. 22]

[FIG. 23]
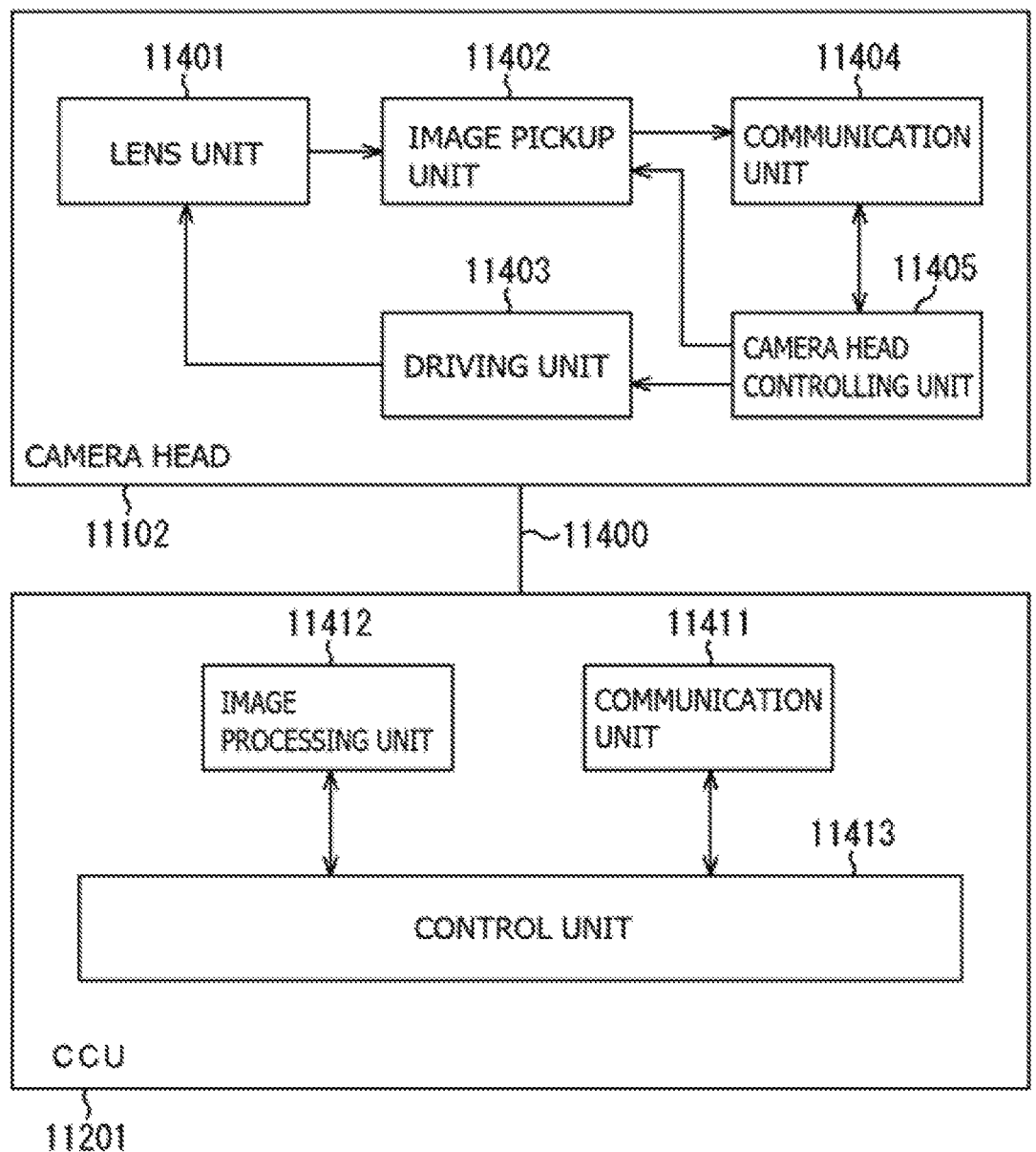

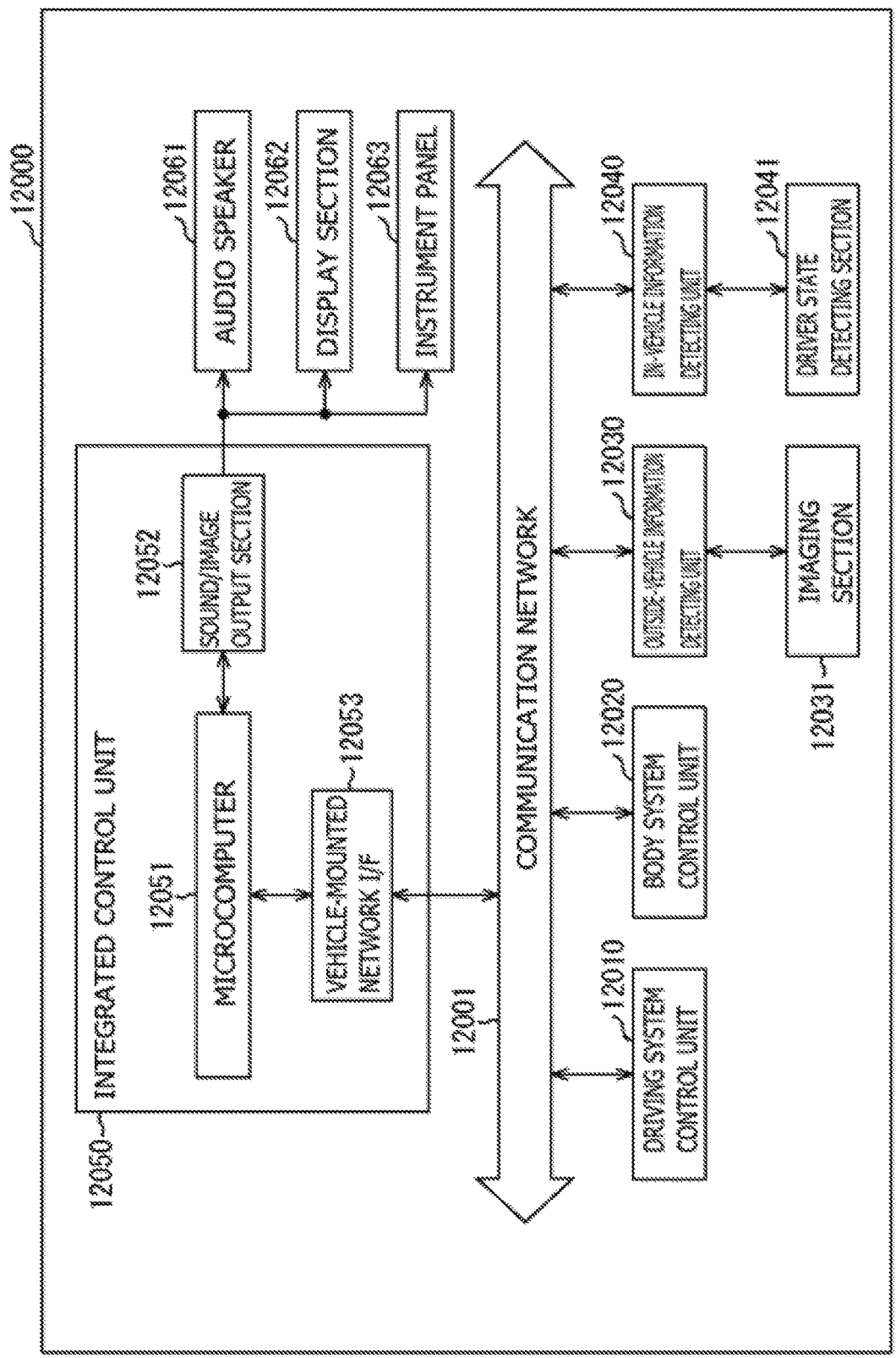
[FIG. 24]

[FIG. 25]
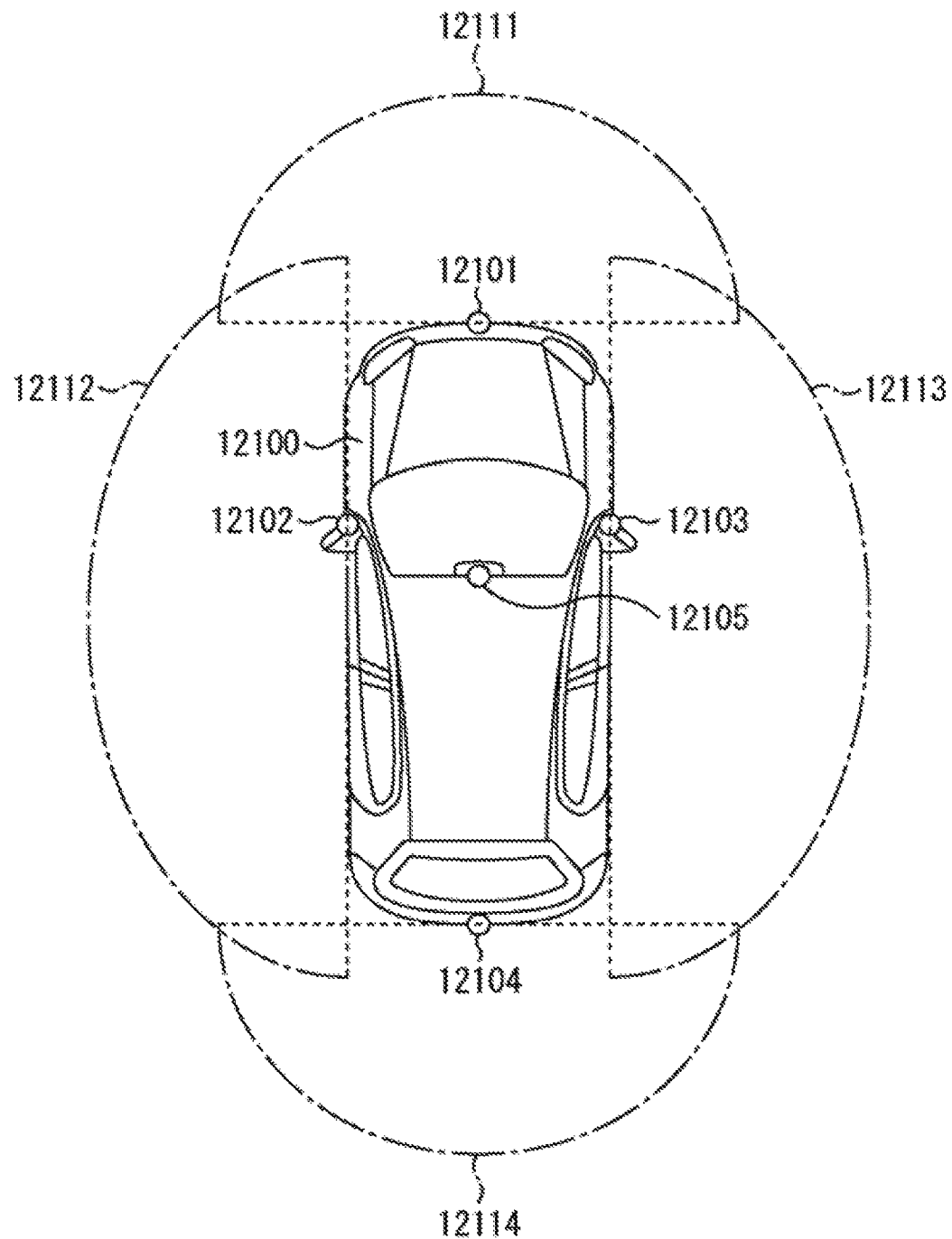

SOLID-STATE IMAGING ELEMENT AND IMAGING APPARATUS

CROSS REFERENCE TO RELATED APPLICATIONS

This application is a U.S. National Phase of International Patent Application No. PCT/JP2019/015254 filed on Apr. 8, 2019, which claims priority benefit of Japanese Patent Application No. JP 2018-088561 filed in the Japan Patent Office on May 2, 2018. Each of the above-referenced applications is hereby incorporated herein by reference in its entirety.

TECHNICAL FIELD

The present technology relates to a solid-state imaging element and an imaging apparatus that include an impurity diffusion region for each pixel region.

BACKGROUND ART

Development of a solid-state imaging element using, for example, a compound semiconductor such as an n-type InGaAs as a photoelectric conversion layer has progressed (e.g., see PTLs 1 and 2). This photoelectric conversion layer is provided with a region where impurities such as ions are diffused, for each pixel region.

CITATION LIST

Patent Literature

PTL 1: Japanese Unexamined Patent Application Publication No. S58-170055
PTL 2: Japanese Unexamined Patent Application Publication No. S 63-224372

SUMMARY OF THE INVENTION

Such a solid-state imaging element has been desired to reduce an amount of generation of a dark current.

It is therefore desirable to provide a solid-state imaging element and an imaging apparatus that make it possible to reduce an amount of generation of a dark current.

A solid-state imaging element (1) according to an embodiment of the present disclosure includes: a photoelectric conversion layer of a first electrical conductivity type including a plurality of pixel regions; an electrode electrically coupled to the photoelectric conversion layer and provided for each of the pixel regions; a semiconductor layer provided between the electrode and the photoelectric conversion layer and having a bandgap larger than a bandgap of the photoelectric conversion layer; a diffusion part disposed in a vicinity of an edge of the pixel region and including an impurity of a second electrical conductivity type that is diffused from the semiconductor layer across the photoelectric conversion layer; and a non-diffusion part provided inside the diffusion part and not including the impurity of the second electrical conductivity type in the photoelectric conversion layer. For example, the first electrical conductivity type is an n-type, and the second electrical conductivity type is a p-type.

An imaging apparatus according to an embodiment of the present disclosure includes the solid-state imaging element (1) according to an embodiment of the present disclosure.

In the solid-state imaging element (1) and the imaging apparatus according to respective embodiments of the present disclosure, the photoelectric conversion layer of the first electrical conductivity type is provided with the non-diffusion part not including the impurity of the second electrical conductivity type. This suppresses generation of a depletion layer in the photoelectric conversion layer, as compared with a case where the impurity of the second electrical conductivity type is diffused in most of the pixel region (see FIGS. 9A and 9B described later).

A solid-state imaging element (2) according to an embodiment of the present disclosure includes a photoelectric conversion layer including a plurality of pixel regions; an electrode electrically coupled to the photoelectric conversion layer and provided for each of the pixel regions; a semiconductor layer provided between the electrode and the photoelectric conversion layer and having a bandgap larger than a bandgap of the photoelectric conversion layer; and an impurity diffusion region of which at least a portion is provided from the semiconductor layer across the photoelectric conversion layer for each of the pixel regions, in which an area of an interface between the impurity diffusion region and the photoelectric conversion layer is smaller than an area of an interface between the impurity diffusion region and the semiconductor layer.

In the solid-state imaging element (2) according to an embodiment of the present disclosure, the area of the interface between the impurity diffusion region and the photoelectric conversion layer is smaller than the area of the interface between the impurity diffusion region and the semiconductor layer. This suppresses generation of a depletion layer in the photoelectric conversion layer.

A solid-state imaging element (3) according to an embodiment of the present disclosure includes: a photoelectric conversion layer including a plurality of pixel regions; an electrode electrically coupled to the photoelectric conversion layer and provided for each of the pixel regions; a semiconductor layer provided between the electrode and the photoelectric conversion layer and having a bandgap larger than a bandgap of the photoelectric conversion layer; and an impurity diffusion region of which at least a portion is provided from the semiconductor layer across the photoelectric conversion layer for each of the pixel regions, in which interfaces between two or more of the impurity diffusion regions and the semiconductor layer are provided for each of the pixel regions.

The solid-state imaging element (3) according to an embodiment of the present disclosure includes the interfaces between the two or more impurity diffusion regions and the semiconductor layer for each of the pixel regions. This suppresses generation of a depletion layer in the photoelectric conversion layer as compared with a case where an interface between one impurity diffusion region and the semiconductor layer is provided for each of the pixel regions (see FIGS. 9A and 9B described later).

According to the solid-state imaging element (1) and the imaging apparatus of respective embodiments of the present disclosure, the non-diffusion part not including the impurity of the second electrical conductivity type is provided in the photoelectric conversion layer of the first electrical conductivity type. According to the solid-state imaging element (2) of an embodiment of the present disclosure, the area of the interface between the impurity diffusion region and the photoelectric conversion layer is smaller than the area of the interface between the impurity diffusion region and the semiconductor layer. According to the solid-state imaging element (3) of an embodiment of the present disclosure, the interfaces between two or more impurity diffusion regions and the semiconductor layer are provided for each of the pixel regions. This suppresses the generation of the dark current caused by the depletion layer in the photoelectric conversion layer. Thus, it becomes possible to reduce an amount of the generation of the dark current. It is to be noted that the effects described here are not necessarily limitative and may be any of the effects described in the present disclosure.

BRIEF DESCRIPTION OF THE DRAWINGS

FIG. 1 is a block diagram illustrating an example of functional configuration of an imaging element according to an embodiment of the present disclosure.

FIG. 2 schematically illustrates a cross-sectional configuration of a light-receiving region illustrated in FIG. 1.

FIG. 3 is a schematic plan view of an example of a configuration of a diffusion region illustrated in FIG. 2.

FIG. 4 is a schematic plan view of another example (1) of the configuration of the diffusion region illustrated in FIG. 3.

FIG. 5 is a schematic plan view of another example (2) of the configuration of the diffusion region illustrated in FIG. 3.

FIG. 6 is a schematic cross-sectional view of one step of a method of manufacturing the imaging element illustrated in FIG. 1.

FIG. 7A is a schematic cross-sectional view of a step subsequent to FIG. 6.

FIG. 7B is a schematic view of a planar configuration of openings in an insulating film illustrated in FIG. 7A.

FIG. 8A is a schematic cross-sectional view of a step subsequent to FIG. 7A.

FIG. 8B is a schematic view of a planar configuration of openings in a passivation film illustrated in FIG. 8A.

FIG. 9A is a schematic cross-sectional view of a configuration of a light-receiving region of an imaging element according to a comparative example.

FIG. 9B is a schematic plan view of a configuration of a diffusion region illustrated in FIG. 9A.

FIG. 10 is a schematic cross-sectional view of another example of the imaging element illustrated in FIG. 9A.

FIG. 11 is a schematic cross-sectional view of an outline configuration of a main part of an imaging element according to Modification Example 1.

FIG. 12 is a schematic view of a planar configuration of a cap layer illustrated in FIG. 11.

FIG. 13 is a schematic cross-sectional view of one step of a method of manufacturing the imaging element illustrated in FIG. 11.

FIG. 14 is a schematic cross-sectional view of a step subsequent to FIG. 13.

FIG. 15 is a schematic cross-sectional view of a step subsequent to FIG. 14.

FIG. 16 is a schematic cross-sectional view of a step subsequent to FIG. 15.

FIG. 17A is a schematic plan view of an outline configuration of a main part of an imaging element according to Modification Example 2.

FIG. 17B is a schematic view of a cross-sectional configuration taken along a line B-B' illustrated in FIG. 17A.

FIG. 18A is a schematic plan view of an outline configuration of a main part of an imaging element according to Modification Example 3.

FIG. 18B is a schematic view of a cross-sectional configuration taken along a line B-B' illustrated in FIG. 18A.

FIG. 19A is a schematic plan view of another example of the imaging element illustrated in FIG. 18A.

FIG. 19B is a schematic view of a cross-sectional configuration taken along a line B-B' illustrated in FIG. 19A.

FIG. 20 is a functional block diagram illustrating an example of an imaging apparatus (electronic apparatus) using the imaging element illustrated in FIG. 1, etc.

FIG. 21 is a block diagram depicting an example of a schematic configuration of an in-vivo information acquisition system.

FIG. 22 is a view depicting an example of a schematic configuration of an endoscopic surgery system.

FIG. 23 is a block diagram depicting an example of a functional configuration of a camera head and a camera control unit (CCU).

FIG. 24 is a block diagram depicting an example of schematic configuration of a vehicle control system.

FIG. 25 is a diagram of assistance in explaining an example of installation positions of an outside-vehicle information detecting section and an imaging section.

MODES FOR CARRYING OUT THE INVENTION

Hereinafter, description is given in detail of embodiments of the present technology with reference to the drawings. It is to be noted that the description is given in the following order.

1. Embodiment (Example of Imaging Element Including Diffusion Part and Non-Diffusion Part)
2. Modification Example 1 (Example of Including Cap Layer between Semiconductor Layer and Electrode)
3. Modification Example 2 (Example of Including a Plurality of Diffusion Parts for Each Pixel Region)
4. Modification Example 3 (Example in which Semiconductor Layer of Non-Diffusion Part Includes No Impurities)
5. Application Example (Example of Imaging Apparatus)
6. Practical Application examples

1. Embodiment

[Configuration of Imaging Element 1]

FIG. 1 schematically illustrates an example of a functional configuration of a solid-state imaging element (an imaging element 1) according to an embodiment of the present disclosure. The imaging element 1 is, for example, an infrared-ray image sensor, and is sensitive to light having a wavelength of 800 nm or more, for example. The imaging element 1 is provided with, for example, a quadrangle-shaped light-receiving region 10P and a peripheral region 10S outside the light-receiving region 10P. The peripheral region 10S is provided with a peripheral circuit for driving the light-receiving region 10P.

The light-receiving region 10P of the imaging element 1 is provided with, for example, a plurality of read unit regions (pixel regions P) arranged two-dimensionally. The peripheral circuit provided in the peripheral region 10S includes, for example, a row scanning section 201, a horizontal selection section 203, a column scanning section 204, and a system control section 202.

To the pixel region P, for example, pixel drive lines Lread (e.g., row selection lines and reset control lines) are wired on a pixel-row basis, and vertical signal lines Lsig are wired on a pixel-column basis. The pixel drive line Lread transmits a drive signal for reading of a signal from the pixel region P.

One end of the pixel drive line Lread is coupled to an output terminal corresponding to each row in the row scanning section 201.

The row scanning section 201 is configured by a shift register, an addresses decoder, and the like, and is, for example, a pixel drive section that drives the respective pixel regions P of the light-receiving region 10P on a row-unit basis. Signals outputted from the respective pixel regions P in the pixel row selectively scanned by the row scanning section 201 are supplied to the horizontal selection section 203 through the respective vertical signal lines Lsig. The horizontal selection section 203 is configured by an amplifier, a horizontal selection switch, and the like that are provided for each of the vertical signal lines Lsig.

The column scanning section 204 is configured by a shift register, an address decoder, and the like, and sequentially drives respective horizontal selection switches in the horizontal selection section 203 while scanning. As a result of the selective scanning by the column scanning section 204, signals of respective pixels to be transmitted through the respective vertical signal lines Lsigs are outputted sequentially to a horizontal signal line 205, and are inputted to an unillustrated signal processing section or the like through the horizontal signal line 205.

The system control section 202 receives a clock supplied from the outside, data instructing an operation mode, or the like, and outputs data such as internal information of the imaging element 1. The system control section 202 further includes a timing generator that generates various timing signals, and performs drive control of the row scanning section 201, the horizontal selection section 203, and the column scanning section 204 on the basis of the various timing signals generated by the timing generator.

FIG. 2 schematically illustrates a cross-sectional configuration of the light-receiving region 10P of the imaging element 1. The light-receiving region 10P of the imaging element 1 is, for example, a region for photoelectrically converting incident light such as light having a wavelength of an infrared region for each pixel region P, and includes a photoelectric conversion layer 11, a semiconductor layer 12, a passivation film 13, and an electrode 14 in this order. The photoelectric conversion layer 11 and the semiconductor layer 12 are provided with a region (a diffusion region 10A) in which, for example, impurities such as ions are diffused, for each pixel region P. A gap 10B is provided between adjacent diffusion regions 10A. For example, a boundary between adjacent pixel regions P is disposed at the middle part of the gap 10B. When light is incident on one surface (a surface opposite to a surface on which the semiconductor layer 12 is provided) of the photoelectric conversion layer 11, the light is absorbed by the photoelectric conversion layer 11, causing signal charges to be generated. The signal charges generated in the photoelectric conversion layer 11 move to, for example, a circuit substrate (not illustrated) via the diffusion region 10A and the electrode 14 for each pixel region P. The circuit substrate is provided, for example, a readout circuit (ROIC: Readout Integrated Circuit) for the signal charges, and the signal charges are read out for each pixel region P. Hereinafter, description is given of a configuration of each component.

The photoelectric conversion layer 11 is provided, for example, in common to all the pixel regions P. In other words, the photoelectric conversion layer 11 is provided with a plurality of pixel regions P. The photoelectric conversion layer 11 absorbs light of a predetermined wavelength to generate signal charges, and is configured, for example, by a material of a compound semiconductor such as an n-type (first electrical conductivity type) group III-V compound semiconductor. Examples of the group III-V compound semiconductor that configures the photoelectric conversion layer 11 include InP (indium phosphide), InGaAs (indium gallium arsenide), GaAsSb (gallium arsenide antimonide), GaSb (gallium antimonide), InAs (indium arsenide), InSb (indium antimonide), InGaAsP (indium gallium arsenide phosphide), and InGaAlAs (indium gallium aluminum arsenide). For example, InGaAs/GaAsSb superlattice structure may be used to configure the photoelectric conversion layer 11. In the photoelectric conversion layer 11, for example, photoelectric conversion of light having a wavelength from a visible region to a short infrared region is performed.

The semiconductor layer 12 provided between the photoelectric conversion layer 11 and the electrode 14 is provided, for example, in common to all the pixel regions P. The diffusion region 10A provided in the semiconductor layer 12 and the photoelectric conversion layer 11A allows the adjacent pixel regions P to be electrically separated. The semiconductor layer 12 has a bandgap larger than a bandgap of the photoelectric conversion layer 11. Specifically, the semiconductor layer 12 is configured by a compound semiconductor material having a bandgap larger than a bandgap of a compound semiconductor material that configures the photoelectric conversion layer 11. For example, the semiconductor layer 12 is configured by an n-type group III-V semiconductor. For example, n-type InGaAs (indium gallium arsenide) may be used for the photoelectric conversion layer 11, and n-type InP (indium phosphide) may be used for the semiconductor layer 12. The semiconductor layer 12 may also be configured by, other than that described above, InGaAs (indium gallium arsenide), GaAsSb (gallium arsenide antimonide), InGaAsP (indium gallium arsenide phosphide), InGaAlAs (indium gallium aluminum arsenide), InAlAs (indium aluminum arsenide), InAlAsSb (indium aluminum arsenide antimonide), or AlAsSb (aluminum arsenide antimonide), or the like.

The diffusion regions 10A provided in the semiconductor layer 12 and the photoelectric conversion layer 11 are spaced apart from each other. Depletion layers generated in the vicinity of interfaces between the semiconductor layer 12 as well as the photoelectric conversion layer 11 and the diffusion region 10A are preferably separated for each pixel region P. The electrode 14 is coupled to the diffusion region 10A provided for each pixel region P. In other words, the diffusion region 10A is provided to be opposed to the electrode 14. The diffusion region 10A is provided for reading the signal charges generated in the photoelectric conversion layer 11 for each pixel region P, and includes a p-type (second electrical conductivity type) impurity, for example. Examples of the p-type impurity include Zn (zinc) and Be (beryllium). A p-n junction interface is thus formed between the diffusion region 10A and the semiconductor layer 12 other than the diffusion region 10A, electrically separating the adjacent pixel regions P.

In the present embodiment, the diffusion region 10A includes a diffusion part 10AA disposed in the vicinity of an edge of the pixel region P and a non-diffusion part 10AB disposed inside the diffusion part 10AA. The diffusion part 10AA is a part where impurities are diffused across the semiconductor layer 12 and the photoelectric conversion layer 11. In the diffusion part 10AA, the impurities are also spread in a thickness direction (Z direction in FIG. 2) of the semiconductor layer 12, and are diffused in a portion of the thickness direction of the photoelectric conversion layer 11. The non-diffusion part 10AB is a part where the impurities remain in the semiconductor layer 12, and the photoelectric conversion layer 11 in the non-diffusion part 10AB includes no impurities. Although details are described later, providing the non-diffusion part 10AB inside the diffusion part 10AA suppresses generation of a depletion layer in the photoelectric conversion layer 11 as compared with a case where impurities of the second electrical conductivity type are diffused into most of a pixel region (see FIGS. 9A and 9B described later).

FIG. 3 illustrates an example of a planar configuration of the diffusion part 10AA and the non-diffusion part 10AB. A cross-sectional configuration taken along a line II-II' of FIG. 3 corresponds to FIG. 2.

The diffusion parts 10AA are provided one by one in the vicinities of the edges of the respective pixel regions P, for example. Specifically, the diffusion part 10AA is disposed in the vicinity of a periphery of a region (an opening of the passivation film 13 described later) exposed from the passivation film 13, of the semiconductor layer 12 and the photoelectric conversion layer 11. The diffusion part 10AA has, for example, a quadrangular frame-like planar shape to surround the non-diffusion part 10AB. A distance between adjacent diffusion parts 10AA is substantially the same as a distance between the adjacent diffusion regions 10A (gap 10B).

The non-diffusion parts 10AB are provided one by one at the middle parts of the respective pixel regions P, for example. The non-diffusion part 10AB has, for example, a quadrangular planar shape. The non-diffusion part 10AB is provided, for example, continuously to the diffusion part 10AA. The non-diffusion part 10AB is preferably provided across a wide region of the middle part of the diffusion region 10A.

FIGS. 4 and 5 illustrate other examples of the planar configuration of the diffusion part 10AA and the non-diffusion part 10AB. For example, the diffusion part 10AA and the non-diffusion part 10AB may have a circular planar shape (FIG. 4). Alternatively, the diffusion part 10AA may not be provided on the entire edge of each pixel region P, but may be provided on a portion of the edge of each pixel region P. For example, the diffusion part 10AA may have a C-shaped planar shape.

The diffusion part 10AA and the non-diffusion part 10AB allow for formation of interfaces with respect to two diffusion regions 10A in the semiconductor layer 12 for each pixel region P. Specifically, each pixel region P includes an interface between the diffusion part 10AA and the semiconductor layer 12 disposed in the vicinity of the edge, and an interface between the non-diffusion part 10AB and the semiconductor layer 12 disposed at the middle part.

In each pixel region P, an area of an interface between the diffusion region 10A (diffusion part 10AA) and the photoelectric conversion layer 11 is preferably smaller than an area of the interface between the diffusion region 10A and the semiconductor layer 12. In other words, it is preferable to adjust sizes of the diffusion part 10AA and the non-diffusion part 10AB to cause the area of the interface between the diffusion region 10A and the photoelectric conversion layer 11 to be smaller than the area of the interface between the diffusion region 10A and the semiconductor layer 12. This suppresses generation of a depletion layer in the photoelectric conversion layer 11.

The passivation film 13 provided between the semiconductor layer 12 and the electrode 14 has an opening to be opposed to the diffusion region 10A of each pixel region P. The electrode 14 is provided in the opening of the passivation film 13 for each pixel region P. The passivation film 13 is configured by, for example, an inorganic insulating material. Examples of the inorganic insulating material include silicon nitride (SiN), aluminum oxide ($Al_2O_3$), silicon oxide ($SiO_2$), and hafnium oxide ($HfO_2$).

The electrode 14 is electrically coupled to the photoelectric conversion layer 11 via the semiconductor layer 12. The electrode 14 is an electrode to be supplied with a voltage for reading signal charges (holes or electrons; hereinafter, description is given, assuming that signal charges are holes, for the sake of convenience) generated in the photoelectric conversion layer 11; the electrode 14 is provided separately for each pixel region P. The electrode 14 is provided at a position to be opposed to the diffusion region 10A, and the middle part of the electrode 14 is in contact with the semiconductor layer 12. A peripheral part of the electrode 14 is provided on the passivation film 13, and adjacent electrodes 14 are electrically separated by the passivation film 13. The electrode 14 has, for example, a quadrangular planar shape.

The electrode 14 is configured by, for example, a simple substance of any one of titanium (Ti), tungsten (W), titanium nitride (TiN), platinum (Pt), gold (Au), copper (Cu), palladium (Pd), zinc (Zn), nickel (Ni), and aluminum (Al), or an alloy containing at least one of those. The electrode 14 may be a single film of such a constituent material, or may be a stacked film in which two or more thereof are combined. For example, the electrode 14 is configured by a stacked film of titanium and tungsten.

[Method of Manufacturing Imaging Element 1]

Such an imaging element 1 may be manufactured, for example, as follows (FIGS. 6, 7A, 7B, 8A, and 8B).

First, a stacked structure of the photoelectric conversion layer 11 and the semiconductor layer 12 is formed using an epitaxial growth method. Next, as illustrated in FIG. 6, an insulating film 13M is formed on the entire surface of the semiconductor layer 12. In a subsequent step, the passivation film 13 is formed by the insulating film 13M Next, as illustrated in FIG. 7A, a frame-like opening 13MA is formed in the insulating film 13M for each pixel region P, and the opening 13MA is used to form the diffusion part 10AA. FIG. 7B illustrates a planar shape of the openings 13MA illustrated in FIG. 7A, and a cross-sectional configuration taken along a line A-A' of FIG. 7B corresponds to FIG. 7A. The opening 13MA is formed in the vicinity of the edge of each pixel region P. Deep ion implantation of zinc (Zn) or the like, for example, is performed from the semiconductor layer 12 via the opening 13MA, thereby causing impurities such as zinc to be diffused into the semiconductor layer 12 and the photoelectric conversion layer 11, thus forming the diffusion part 10AA. At this time, a portion of the insulating film 13M (an insulating film 13B) is provided at the middle part of each pixel region P.

After the formation of the diffusion part 10AA, the non-diffusion part 10AB is formed as illustrated in FIG. 8A. Specifically, after removal of the insulating film 13B disposed at the middle part of each pixel region P, shallow ion implantation of zinc or the like, for example, is performed from the semiconductor layer 12 via an opening of the passivation film 13. This causes the impurities such as zinc to remain in the semiconductor layer 12, thus forming the non-diffusion part 10AB. FIG. 8B illustrates a planar shape of the passivation film 13 illustrated in FIG. 8A, and a cross-sectional configuration taken along a line A-A' in FIG. 8B corresponds to FIG. 7A.

After the formation of the non-diffusion part 10AB for each pixel region P, the electrode 14 is formed in the opening of the passivation film 13. For example, the imaging element 1 is able to be manufactured in this manner.

[Operation of Imaging Element 1]

In the imaging element 1, when light (e.g., light of a wavelength in an infrared region) is incident on one surface of the photoelectric conversion layer 11, the light is absorbed in the photoelectric conversion layer 11. This causes a pair of holes (holes) and electrons to be generated (photoelectric conversion occurs) in the photoelectric conversion layer 11. At this time, when a predetermined voltage is applied between the electrode 14 and the photoelectric conversion layer 11, for example, potential gradient occurs in the photoelectric conversion layer 11, thus causing one (e.g., holes) of the generated charges to move as signal charges to the diffusion region 10A and to be collected to the electrode 14 from the diffusion region 10A for each pixel region P. The signal charges are read, for example, by the ROIC of the circuit substrate.

[Workings and Effects of Imaging Element 1]

The imaging element 1 of the present embodiment is provided with the non-diffusion part 10AB including no impurities in the photoelectric conversion layer 11, thus suppressing generation of a depletion layer in the photoelectric conversion layer 11 as compared with the case where the impurities of the second electrical conductivity type are diffused into most of the pixel region (see FIGS. 9A and 9B described later). This is described below.

FIG. 9A illustrates a schematic cross-sectional configuration of a light-receiving region of an imaging element (an imaging element 100) according to a comparative example. FIG. 9B illustrates a schematic planar configuration of the imaging element 100. A cross-sectional configuration taken along a line A-A' in FIG. 9B corresponds to FIG. 9A. The imaging element 100 includes the photoelectric conversion layer 11, the semiconductor layer 12, the passivation film 13, and the electrode 14, and the photoelectric conversion layer 11 and the semiconductor layer 12 of the imaging element 100 are provided with an impurity diffusion region (a diffusion region 100A) for each pixel region P. Most of the diffusion region 100A is configured by a diffusion part 100AA in which impurities are diffused into the photoelectric conversion layer 11 from the semiconductor layer 12. The diffusion part 100AA is provided across a wide region of the middle part of each pixel region P.

In such an imaging element 100, an interface between the photoelectric conversion layer 11 and the diffusion region 100A is formed to be large, thus also causing a depletion layer generated in the vicinity of the interface to have a large volume. In the imaging element 100, a large number of dark currents are generated due to the depletion layer.

A method may be conceivable that reduces a size of the interface between the photoelectric conversion layer 11 and the diffusion region 100A by reducing an area of the diffusion region 100A (FIG. 10 described later).

In the imaging element 100 illustrated in FIG. 10, the diffusion region 100A is provided only in a portion (middle part) of each pixel region P. Reducing a size of the diffusion region 100A in this manner makes it possible to reduce the size of the interface between the photoelectric conversion layer 11 and the diffusion region 100A. In this case, however, a distance between adjacent diffusion regions 100A is increased as compared with the imaging element 100 illustrated in FIG. 9A. Specifically, a size of the gap 10B is increased. Signal charges generated between the adjacent diffusion regions 100A are moved due to diffusion. Therefore, when the distance (size of the gap 10B) between the adjacent diffusion regions 100A is increased, the signal charges are more likely to move across the plurality of pixel regions P. That is, crosstalk is more likely to occur.

In contrast, in the imaging element 1, the diffusion part 10AA is provided in the vicinity of the edge of each pixel region P, and the non-diffusion part 10AB is provided inside the diffusion part 10AA. In the non-diffusion part 10AB, the photoelectric conversion layer 11 includes no impurities, thus generating no interface between the photoelectric conversion layer 11 and the diffusion region 10A. Accordingly, providing the diffusion region 10A with the non-diffusion part 10AB reduces the size of the interface between the photoelectric conversion layer 11 and the diffusion region 10A, thus making it possible to suppress generation of a depletion layer that takes place in the vicinity of the interface.

In addition, the diffusion part 10AA including impurities in the photoelectric conversion layer 11 is disposed in the vicinity of the edge of each pixel region P, thus reducing the size of the gap 10B. Accordingly it is also possible to suppress the occurrence of the crosstalk.

As described above, in the present embodiment, providing the photoelectric conversion layer 11 with the non-diffusion part 10AB including no impurities, thus suppressing the occurrence of the dark current caused by the depletion layer in the photoelectric conversion layer 11. Thus, it becomes possible to reduce an amount of the generation of the dark current. In addition, the diffusion part 10AA in which impurities are diffused into the semiconductor layer 12 and the photoelectric conversion layer 11 is disposed in the vicinity of the edge of each pixel region P, thus making it possible to suppress the occurrence of crosstalk.

Further, in the non-diffusion part 10AB of the imaging element 1, impurities are diffused into the semiconductor layer 12. In the imaging element 1, it is possible to reduce the depletion layer to be generated in the vicinity of an interface between the semiconductor layer 12 and the passivation film 13 as compared with an imaging element (see an imaging element 1C of FIGS. 18A and 18B described later) in which impurities are not diffused into the semiconductor layer 12 in the non-diffusion part 10AB. Thus, it is possible to more effectively reduce the amount of the generation of the dark current.

Hereinafter, description is given of modification examples of the foregoing embodiment; in the following description, the same components as those of the foregoing embodiment are denoted by the same reference numerals, and descriptions thereof are omitted as appropriate.

Modification Example 1

FIG. 11 illustrates a schematic cross-sectional configuration of the light-receiving region 10P of an imaging element (an imaging element 1A) according to Modification Example 1. The imaging element 1A includes a cap layer 15 between the semiconductor layer 12 and the electrode 14 in the non-diffusion part 10AB. Except for this point, the imaging element 1A has a configuration similar to that of the imaging element 1 of the foregoing embodiment, and workings and effects thereof are also similar.

FIG. 12 illustrates a planar shape of the cap layer 15. The cap layer 15 is provided at the middle part of each pixel region P, and has a quadrangular planar shape, for example. The cap layer 15 has a planar shape that is substantially the same as the planar shape of the non-diffusion part 10AB. The cap layer 15 is provided separately for each pixel region P.

The cap layer 15 is selectively provided on a region opposed to the non-diffusion part 10AB, of the diffusion region 10A provided in the photoelectric conversion layer 11 and the semiconductor layer 12 (FIG. 11). As described later, the non-diffusion part 10AB provided with the cap layer 15 has a reduced diffusion depth of impurities, thus forming the non-diffusion part 10AB that is shallower than the diffusion part 10AA.

It is possible to use, for example, a p-type group III-V compound semiconductor as the cap layer 15. Specifically, it is possible to use, as the cap layer 15, a p-type InGaAs, GaAsSb, InGaAsP, InGaAlAs, InP, InAlAs, InAlAsSb, AlAsSb, or the like.

The imaging element 1A including such a cap layer 15 is manufactured, for example, as follows (FIGS. 13 to 16).

First, as illustrated in FIG. 13, for example, an epitaxial growth method is used to form the photoelectric conversion layer 11, the semiconductor layer 12, and a cap layer material layer 15M in this order. Next, as illustrated in FIG. 14, the cap layer material layer 15M is patterned using, for example, photolithography and an etching method to form the cap layer 15. The cap layer 15 is formed at the middle part of each pixel region P.

After the formation of the cap layer 15, the insulating film 13M is formed on the entire surface of the semiconductor layer 12 to cover the cap layer 15, as illustrated in FIG. 15. The insulating film 13M is patterned using, for example, photolithography and an etching method to form the passivation film 13.

Next, as illustrated in FIG. 16, shallow ion implantation of zinc (Zn) or the like, for example, is performed from the semiconductor layer 12 or the cap layer 15 via an opening of the passivation film 13. At this time, in a region (diffusion part 10AA) without the cap layer 15, impurities such as zinc are diffused into the photoelectric conversion layer 11 from the semiconductor layer 12, thus forming the diffusion part 10AA. Meanwhile, in the ion implantation via the cap layer 15, impurities such as zinc remain in the semiconductor layer 12, thus forming the non-diffusion part 10AB.

Thus, after the formation of the diffusion part 10AA and the non-diffusion part 10AB using the cap layer 15, the electrode 14 is formed in the opening of the passivation film 13. For example, the imaging element 1A is able to be manufactured in this manner.

Similarly to the description given in the foregoing imaging element 1, such an imaging element 1A is also provided with the non-diffusion part 10AB including no impurities in the photoelectric conversion layer 11, thus suppressing the generation of the depletion layer in the photoelectric conversion layer 11.

Modification Example 2

FIG. 17A is a schematic planar configuration of a main part of an imaging element (an imaging element 1B) according to Modification Example 2, and FIG. 17B illustrates a schematic cross-sectional configuration taken along a line B-B' of FIG. 17A. The imaging element 1B includes a plurality of diffusion parts 10AA for each pixel region P. Except for this point, the imaging element 1B has a configuration similar to that of the imaging element 1 of the foregoing embodiment, and workings and effects thereof are also similar.

The plurality of diffusion parts 10AA are disposed in the vicinity of a periphery of each pixel region P in a manner separated from one another. In the example illustrated in FIG. 17A, eight diffusion parts 10AA are separated from one another in one pixel region P. Each of the diffusion parts 10AA has, for example, a circular planar shape. The planar shape of each of the diffusion parts 10AA may be another shape such as a quadrangular shape, for example. In addition, one pixel region P may be provided with nine or more diffusion parts 10AA, or, alternatively, may be provided with seven or less diffusion parts 10AA.

Each pixel region P is provided with the non-diffusion part 10AB to fill a space among the diffusion parts 10AA in the vicinity of the edge from the middle part. In other words, in each pixel region P, the plurality of diffusion parts 10AA are separated from one another by the non-diffusion part 10AB.

Some of the plurality of diffusion parts 10AA may be disposed at the middle part of the pixel region P. In each of the pixel regions P, the diffusion part 10AA at the middle part preferably has a density lower than a density of the diffusion part 10AA in the vicinity of the edge. This makes it possible to more effectively suppress the generation of the dark current.

Similarly to the description given in the foregoing imaging element 1, such an imaging element 1B is also provided with the non-diffusion part 10AB including no impurities in the photoelectric conversion layer 11, thus suppressing the generation of the depletion layer in the photoelectric conversion layer 11.

Modification Example 3

FIG. 18A illustrates a schematic planar configuration of a main part of an imaging element (imaging element 1C) according to Modification Example 3, and FIG. 18B illustrates a schematic cross-sectional configuration taken along a line B-B' of FIG. 18A. No impurities are diffused into the semiconductor layer 12 in the non-diffusion part 10AB of the imaging element 1C. Except for this point, the imaging element 1C has a configuration similar to that of the imaging element 1 of the foregoing embodiment, and workings and effects thereof are also similar.

The imaging element 1C includes, for example, one diffusion part 10AA and one non-diffusion part 10AB for each pixel region P. The diffusion part 10AA is provided, in a frame-like manner, in the vicinity of a periphery of each pixel region P. Impurities are diffused into the photoelectric conversion layer 11 from the semiconductor layer 12 in the diffusion part 10AA. The non-diffusion part 10AB is provided inside the diffusion part 10AA. The non-diffusion part 10AB is provided at the middle part of each pixel region P, and is surrounded by the diffusion part 10AA. In the non-diffusion part 10AB, the semiconductor layer 12 and the photoelectric conversion layer 11 include no impurities. In other words, in the imaging element 1C, the diffusion region 10A of each pixel region P is configured by the diffusion part 10AA.

The diffusion part 10AA and the non-diffusion part 10AB allow for formation of interfaces with respect to two diffusion regions 10A in the semiconductor layer 12 for each pixel region P. Specifically, each pixel region P includes an interface between the semiconductor layer 12 in the gap 10B and the diffusion part 10AA, i.e., an outer interface, and an interface between the diffusion part 10AA and the semiconductor layer 12 in the non-diffusion part 10AB, i.e., an inner interface. This suppresses the generation of the depletion layer in the photoelectric conversion layer 11 for each pixel region P, as compared with the case of including an interface between one impurity diffusion region and the semiconductor layer (see FIGS. 9A and 9B described above).

In each pixel region P, an area of the interface between the diffusion region 10A (diffusion part 10AA) and the photoelectric conversion layer 11 is preferably smaller than the area of the interface between the diffusion region 10A and the semiconductor layer 12. This suppresses the generation of the depletion layer in the photoelectric conversion layer 11.

FIGS. 19A and 19B illustrate another example of the configuration of the imaging element 1C. FIG. 19A illustrates a schematic planar configuration of a main part of the imaging element 1C, and FIG. 19B illustrates a schematic cross-sectional configuration taken along a line B-B' of FIG. 19A. The imaging element 1C may include the plurality of diffusion parts 10AA for each pixel region P.

Application Example

The imaging elements 1, 1A, 1B, or 1C described above is applicable to various types of imaging apparatuses (electronic apparatuses), such as a camera that is able to capture an image of an infrared region, for example. FIG. 20 illustrates a schematic configuration of an electronic apparatus 3 (camera) as an example thereof. The electronic apparatus 3 is, for example, a camera that is able to capture a still image or shoot a moving image, and includes the imaging element 1, 1A, 1B, or 1C, an optical system (optical lens) 310, a shutter device 311, a drive section 313 that drives the imaging element 1, 1A, 1B, or 1C and the shutter device 311, and a signal processing section 312.

The optical system 310 guides image light (incident light) from a subject to the imaging element 1, 1A, 1B, or 1C. The optical system 310 may be configured by a plurality of optical lenses. The shutter device 311 controls periods of light irradiation and light shielding with respect to the imaging element 1, 1A, 1B, or 1C. The drive section 313 controls a transferring operation of the imaging element 1, 1A, 1B, or 1C and a shutter operation of the shutter device 311. The signal processing section 312 performs various types of signal processing on a signal outputted from the imaging element 1, 1A, 1B, or 1C. A video signal Dout after the signal processing is stored in a storage medium such as a memory or outputted to a monitor or the like.

Example of Practical Application to In-Vivo Information Acquisition System

Further, the technology according to an embodiment of the present disclosure (present technology) is applicable to various products. For example, the technology according to an embodiment of the present disclosure may be applied to an endoscopic surgery system.

FIG. 21 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 21, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

The description has been given above of one example of the in-vivo information acquisition system, to which the technology according to an embodiment of the present disclosure is applicable. The technology according to an embodiment of the present disclosure is applicable to, for example, the image pickup unit 10112 of the configurations described above. This makes it possible to improve detection accuracy.

Example of Practical Application to Endoscopic Surgery System

The technology according to an embodiment of the present disclosure (present technology) is applicable to various products. For example, the technology according to an embodiment of the present disclosure may be applied to an endoscopic surgery system.

FIG. 22 is a view depicting an example of a schematic configuration of an endoscopic surgery system to which the technology according to an embodiment of the present disclosure (present technology) can be applied.

In FIG. 22, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 23 is a block diagram depicting an example of a functional configuration of the camera head 11102 and the CCU 11201 depicted in FIG. 22.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The description has been given above of one example of the endoscopic surgery system, to which the technology according to an embodiment of the present disclosure is applicable. The technology according to an embodiment of the present disclosure is applicable to, for example, the image pickup unit 11402 of the configurations described above. Applying the technology according to an embodiment of the present disclosure to the image pickup unit 11402 makes it possible to improve detection accuracy.

It is to be noted that although the endoscopic surgery system has been described as an example here, the technology according to an embodiment of the present disclosure may also be applied to, for example, a microscopic surgery system, and the like.

Example of Practical Application to Mobile Body

The technology according to an embodiment of the present disclosure is applicable to various products. For example, the technology according to an embodiment of the present disclosure may be achieved in the form of an apparatus to be mounted to a mobile body of any kind. Non-limiting examples of the mobile body may include an automobile, an electric vehicle, a hybrid electric vehicle, a motorcycle, a bicycle, any personal mobility device, an airplane, an unmanned aerial vehicle (drone), a vessel, a robot, a construction machine, and an agricultural machine (tractor).

FIG. 24 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 24, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 24, an audio speaker 12061, a display section 12062, and an instrument panel 12063 are illustrated as the output device. The display section 12062 may, for example, include at least one of an on-board display and a head-up display.

FIG. 25 is a diagram depicting an example of the installation position of the imaging section 12031.

In FIG. 25, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 25 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to an embodiment of the present disclosure may be applied has been described above. The technology according to an embodiment of the present disclosure may be applied to the imaging section 12031 out of the configurations described above. Applying the technology according to an embodiment of the present disclosure to the imaging section 12031 makes it possible to obtain a captured image that is easier to see. This makes it possible to decrease fatigue of a driver.

In addition to those described above, the technology according to an embodiment of the present disclosure is applicable to other fields such as a field of factory automation (FA: Factory Automation).

Description has been given hereinabove of contents of the present disclosure referring to the embodiment and the modification examples; however, the contents of the present disclosure are not limited to the foregoing embodiments, etc., and various modifications may be made. For example, the layer configuration of the imaging element described in the foregoing embodiment is merely exemplary, and yet another layer may be provided. For example, the imaging element 1, 1A, 1B, or 1C may include a contact layer opposed to the semiconductor layer 12 with the photoelectric conversion layer 11 interposed therebetween, and an electrode opposed to the photoelectric conversion layer 11 with the contact layer interposed therebetween. In addition, the material and thickness of each layer are also merely exemplary, and are not limited to those described above.

In addition, the description has been given, in the foregoing embodiment, etc., of the case where the first electrical conductivity type is an n-type and the second electrical conductivity type is a p-type in the present disclosure; however, the present disclosure is also applicable to a case where the first electrical conductivity type is a p-type and the second electrical conductivity type is an n-type.

The effects described in the foregoing embodiments, etc. are merely exemplary, and may be other effects or may further include other effects.

It is to be noted that the present disclosure may include the following configurations.

(1)

A solid-state imaging element including:

a photoelectric conversion layer of a first electrical conductivity type including a plurality of pixel regions;

an electrode electrically coupled to the photoelectric conversion layer and provided for each of the pixel regions;

a semiconductor layer provided between the electrode and the photoelectric conversion layer and having a bandgap larger than a bandgap of the photoelectric conversion layer;

a diffusion part disposed in a vicinity of an edge of the pixel region and including an impurity of a second electrical conductivity type that is diffused from the semiconductor layer across the photoelectric conversion layer; and a non-diffusion part provided inside the diffusion part and not including the impurity of the second electrical conductivity type in the photoelectric conversion layer.

(2)

The solid-state imaging element according to (1), in which the impurity of the second electrical conductivity type is diffused into the semiconductor layer in the non-diffusion part.

(3)

The solid-state imaging element according to (1), in which the semiconductor layer in the non-diffusion part does not include the impurity of the second electrical conductivity type.

(4)

The solid-state imaging element according to (1) or (2), in which each of the pixel regions includes the non-diffusion part disposed at a middle part and the diffusion part surrounding the non-diffusion part.

(5)

The solid-state imaging element according to (4), in which one of the diffusion parts is provided for each of the pixel regions.

(6)

The solid-state imaging element according to (4) or (5), in which the diffusion part has a frame-like planar shape.

(7)

The solid-state imaging element according to any one of (1) to (3), in which a plurality of the diffusion parts arranged separately from each other are provided for each of the pixel regions.

(8)

The solid-state imaging element according to (7), in which, in each of the pixel regions, the diffusion part at a middle part has a density that is lower than a density of the diffusion part in the vicinity of the edge.

(9)

The solid-state imaging element according to any one of (1) to (8), further including a cap layer selectively provided between the semiconductor layer and the electrode in the non-diffusion part.

(10)

The solid-state imaging element according to (9), in which the cap layer includes a group III-V compound semiconductor.

(11)

A solid-state imaging element including:
a photoelectric conversion layer including a plurality of pixel regions;
an electrode electrically coupled to the photoelectric conversion layer and provided for each of the pixel regions;
a semiconductor layer provided between the electrode and the photoelectric conversion layer and having a bandgap larger than a bandgap of the photoelectric conversion layer; and
an impurity diffusion region of which at least a portion is provided from the semiconductor layer across the photoelectric conversion layer for each of the pixel regions,
an area of an interface between the impurity diffusion region and the photoelectric conversion layer being smaller than an area of an interface between the impurity diffusion region and the semiconductor layer.

(12)

A solid-state imaging element including:
a photoelectric conversion layer including a plurality of pixel regions;
an electrode electrically coupled to the photoelectric conversion layer and provided for each of the pixel regions;
a semiconductor layer provided between the electrode and the photoelectric conversion layer and having a bandgap larger than a bandgap of the photoelectric conversion layer; and
an impurity diffusion region of which at least a portion is provided from the semiconductor layer across the photoelectric conversion layer for each of the pixel regions,
interfaces between two or more of the impurity diffusion regions and the semiconductor layer being provided for each of the pixel regions.

(13)

The solid-state imaging element according to any one of (1) to (12), in which the photoelectric conversion layer includes the group III-V compound semiconductor.

(14)

The solid-state imaging element according to any one of (1) to (13), in which the photoelectric conversion layer includes indium phosphide, indium gallium arsenide, gallium arsenide antimonide, gallium antimonide, indium arsenide, indium antimonide, indium gallium arsenide phosphide, or indium gallium aluminum arsenide.

(15)

The solid-state imaging element according to any one of (1) to (14), in which the semiconductor layer includes the group III-V compound semiconductor.

(16)

The solid-state imaging element according to any one of (1) to (15), in which the semiconductor layer includes indium gallium arsenide, gallium arsenide antimonide, indium gallium arsenide phosphide, indium gallium aluminum arsenide, indium phosphide, indium aluminum arsenide, indium aluminum arsenide antimonide, or aluminum arsenide antimonide.

(17)

An imaging apparatus including a solid-state imaging element,
the solid-state imaging element including
a photoelectric conversion layer of a first electrical conductivity type including a plurality of pixel regions,
an electrode electrically coupled to the photoelectric conversion layer and provided for each of the pixel regions,
a semiconductor layer provided between the electrode and the photoelectric conversion layer and having a bandgap larger than a bandgap of the photoelectric conversion layer,
a diffusion part disposed in a vicinity of an edge of the pixel region and including an impurity of a second electrical conductivity type that is diffused from the semiconductor layer across the photoelectric conversion layer, and
a non-diffusion part provided inside the diffusion part and not including the impurity of the second electrical conductivity type in the photoelectric conversion layer.

This application claims the benefit of Japanese Priority Patent Application JP2018-88561 filed with the Japan Patent Office on May 2, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A solid-state imaging element, comprising:
a photoelectric conversion layer of a first electrical conductivity type including a plurality of pixel regions;
an electrode electrically coupled to the photoelectric conversion layer and provided for each of the plurality of pixel regions;
a semiconductor layer between the electrode and the photoelectric conversion layer and having a bandgap larger than a bandgap of the photoelectric conversion layer;
a plurality of diffusion parts in each of the plurality of pixel regions, wherein
the plurality of diffusion parts includes an impurity of a second electrical conductivity type that is diffused from the semiconductor layer across the photoelectric conversion layer, and
a first diffusion part, of the plurality of diffusion parts, in a middle part of each of the plurality of pixel regions has a density lower than a density of a second diffusion part, of the plurality of diffusion parts, in a vicinity of an edge; and
a non-diffusion part, in each of the plurality of pixel regions, separates the plurality of the diffusion parts,
wherein, in the non-diffusion part, the photoelectric conversion layer does not include the impurity of the second electrical conductivity type.

2. The solid-state imaging element according to claim 1, wherein
each of the plurality of pixel regions includes at least two diffusion parts, of the plurality of diffusion parts, in the middle part.

3. The solid-state imaging element according to claim 2, wherein the plurality of diffusion parts has a frame-like planar shape.

4. The solid-state imaging element according to claim 1, further comprising a cap layer selectively provided between the semiconductor layer and the electrode in the non-diffusion part.

5. The solid-state imaging element according to claim 4, wherein the cap layer includes a group III-V compound semiconductor.

6. The solid-state imaging element according to claim 1, wherein the photoelectric conversion layer includes a group III-V compound semiconductor.

7. The solid-state imaging element according to claim 1, wherein the photoelectric conversion layer includes indium phosphide, indium gallium arsenide, gallium arsenide antimonide, gallium antimonide, indium arsenide, indium antimonide, indium gallium arsenide phosphide, or indium gallium aluminum arsenide.

8. The solid-state imaging element according to claim 1, wherein the semiconductor layer includes a group III-V compound semiconductor.

9. The solid-state imaging element according to claim 1, wherein the semiconductor layer includes indium gallium arsenide, gallium arsenide antimonide, indium gallium arsenide phosphide, indium gallium aluminum arsenide, indium phosphide, indium aluminum arsenide, indium aluminum arsenide antimonide, or aluminum arsenide antimonide.

10. A solid-state imaging element, comprising:
a photoelectric conversion layer including a plurality of pixel regions;
an electrode electrically coupled to the photoelectric conversion layer and provided for each of the plurality of pixel regions;
a semiconductor layer between the electrode and the photoelectric conversion layer and having a bandgap larger than a bandgap of the photoelectric conversion layer; and
an impurity diffusion region including, in each of the plurality of pixel regions, a plurality of diffusion parts and a non-diffusion part, wherein
in each of the plurality of pixel regions, the non-diffusion part separates the plurality of diffusion parts,
the plurality of diffusion parts includes an impurity of an electrical conductivity type diffused from the semiconductor layer across the photoelectric conversion layer for each of the plurality of pixel regions,
a first diffusion part, of the plurality of diffusion parts, in a middle part of each of the plurality of pixel regions has a density lower than a density of a second diffusion part, of the plurality of diffusion parts, in a vicinity of an edge;
an area of an interface between the impurity diffusion region and the photoelectric conversion layer is smaller than an area of an interface between the impurity diffusion region and the semiconductor layer, and
in the non-diffusion part, the photoelectric conversion layer does not include the impurity of the electrical conductivity type.

11. A solid-state imaging element, comprising:
a photoelectric conversion layer including a plurality of pixel regions;
an electrode electrically coupled to the photoelectric conversion layer and provided for each of the plurality of pixel regions;
a semiconductor layer between the electrode and the photoelectric conversion layer and having a bandgap larger than a bandgap of the photoelectric conversion layer; and
an impurity diffusion region including, in each of the plurality of pixel regions, a plurality of diffusion parts and a non-diffusion part, wherein
the plurality of diffusion parts includes an impurity of an electrical conductivity type diffused from the semiconductor layer across the photoelectric conversion layer for each of the plurality of pixel regions,
a first diffusion part, of the plurality of diffusion parts, in a middle part of each of the plurality of pixel regions has a density lower than a density of a second diffusion part, of the plurality of diffusion parts, in a vicinity of an edge,
interfaces between two or more of the impurity diffusion regions and the semiconductor layer is provided for each of the plurality of pixel regions,
in each of the plurality of pixel regions, the non-diffusion part separates the plurality of diffusion parts, and
in the non-diffusion part, the photoelectric conversion layer does not include the impurity of the electrical conductivity type.

12. An imaging apparatus, comprising:
a solid-state imaging element, wherein the solid-state imaging element including:
a photoelectric conversion layer of a first electrical conductivity type including a plurality of pixel regions,
an electrode electrically coupled to the photoelectric conversion layer and provided for each of the plurality of pixel regions,
a semiconductor layer between the electrode and the photoelectric conversion layer and having a bandgap larger than a bandgap of the photoelectric conversion layer,
a plurality of diffusion parts in each of the plurality of pixel regions, wherein
the plurality of diffusion parts includes an impurity of a second electrical conductivity type that is diffused from the semiconductor layer across the photoelectric conversion layer, and
a first diffusion part, of the plurality of diffusion parts, in a middle part of each of the plurality of pixel regions has a density lower than a density of a second diffusion part, of the plurality of diffusion parts, in a vicinity of an edge, and
a non-diffusion part, in each of the plurality of pixel regions, separates the plurality of the diffusion parts,
wherein, in the non-diffusion part, the photoelectric conversion layer does not include the impurity of the second electrical conductivity type.

* * * * *